(12) United States Patent
Fricker

(10) Patent No.: US 10,840,216 B2
(45) Date of Patent: Nov. 17, 2020

(54) SYSTEMS AND METHODS FOR POWERING AN INTEGRATED CIRCUIT HAVING MULTIPLE INTERCONNECTED DIE

(71) Applicant: Cerebras Systems Inc., Los Altos, CA (US)

(72) Inventor: Jean-Philippe Fricker, Los Altos, CA (US)

(73) Assignee: Cerebras Systems Inc., Los Altos, CA (US)

(*) Notice: Subject to any disclaimer, the term of this patent is extended or adjusted under 35 U.S.C. 154(b) by 0 days.

(21) Appl. No.: 16/810,520

(22) Filed: Mar. 5, 2020

(65) Prior Publication Data

US 2020/0286858 A1   Sep. 10, 2020

Related U.S. Application Data

(60) Provisional application No. 62/813,889, filed on Mar. 5, 2019.

(51) Int. Cl.
| | | |
|---|---|---|
| H05K 1/02 | (2006.01) |
| H05K 1/14 | (2006.01) |
| H05K 7/10 | (2006.01) |
| H01L 21/60 | (2006.01) |
| H01L 21/78 | (2006.01) |
| H01L 23/00 | (2006.01) |
| H01L 23/31 | (2006.01) |
| H01L 23/34 | (2006.01) |
| H01L 23/38 | (2006.01) |

(Continued)

(52) U.S. Cl.
CPC .......... *H01L 25/0655* (2013.01); *H01L 23/32* (2013.01); *H01L 23/367* (2013.01); *H01L 23/473* (2013.01); *H01L 23/49811* (2013.01); *H01L 23/49827* (2013.01); *H01L 24/48* (2013.01); *H01L 2224/48137* (2013.01)

(58) Field of Classification Search
CPC ... H05K 1/02; H05K 1/14; H05K 7/10; H01L 21/60; H01L 21/78; H01L 23/00; H01L 23/31; H01L 23/34; H01L 23/38; H01L 23/48; H01L 23/50; H01L 23/52; H01L 23/64; H01L 23/498; H01L 23/522; H01L 23/538
USPC .............. 361/700, 704, 760, 764, 783, 809; 257/200, 401, 500, 506, 532, 691, 707, 257/724, 726, 727; 438/107, 108
See application file for complete search history.

(56) References Cited

U.S. PATENT DOCUMENTS

| | | |
|---|---|---|
| 4,932,883 A | 6/1990 | Hsia et al. |
| 4,998,885 A | 3/1991 | Beaman |

(Continued)

OTHER PUBLICATIONS

"International Search Report and Written Opinion for PCT Application No. PCT/US18/039700, dated Sep. 13, 2018."

(Continued)

*Primary Examiner* — Xiaoliang Chen
(74) *Attorney, Agent, or Firm* — Jeffrey Schox

(57) ABSTRACT

The power on wafer assembly can include: a compliant connector, an integrated circuit, a printed circuit board (PCB), a power component, and a set of compliant connectors. The power on wafer assembly can optionally include: a compression element, a cooling system, a set of mechanical clamping components, and a power source. However, the power on wafer assembly can additionally or alternately include any other suitable components.

9 Claims, 21 Drawing Sheets

(51) Int. Cl.

| | | |
|---|---|---|
| H01L 23/48 | (2006.01) | |
| H01L 23/50 | (2006.01) | |
| H01L 23/52 | (2006.01) | |
| H01L 23/64 | (2006.01) | |
| H01L 23/498 | (2006.01) | |
| H01L 23/522 | (2006.01) | |
| H01L 23/538 | (2006.01) | |
| H01L 25/065 | (2006.01) | |
| H01L 23/473 | (2006.01) | |
| H01L 23/367 | (2006.01) | |
| H01L 23/32 | (2006.01) | |

(56) References Cited

U.S. PATENT DOCUMENTS

| | | | |
|---|---|---|---|
| 5,007,841 A * | 4/1991 | Smolley | G01R 1/07307 257/E23.172 |
| 5,140,405 A | 8/1992 | King et al. | |
| 5,793,618 A * | 8/1998 | Chan | H01R 13/6215 257/726 |
| 6,281,577 B1 | 8/2001 | Oppermann et al. | |
| 6,477,058 B1 | 11/2002 | Luebs et al. | |
| 6,809,417 B1 * | 10/2004 | Rossetti | F25B 21/00 257/691 |
| 6,837,719 B2 * | 1/2005 | Panella | H05K 1/0262 439/67 |
| 6,853,559 B2 | 2/2005 | Panella et al. | |
| 6,936,521 B2 | 8/2005 | Chien | |
| 7,129,577 B2 | 10/2006 | Maxwell | |
| 7,681,309 B2 | 3/2010 | Miller | |
| 8,316,329 B1 | 11/2012 | Rigby et al. | |
| 10,504,848 B1 * | 12/2019 | Parto | H01L 28/10 |
| 2002/0030972 A1 * | 3/2002 | Ali | H01L 23/427 361/704 |
| 2002/0185661 A1 | 12/2002 | Kawanobe et al. | |
| 2003/0006493 A1 | 1/2003 | Shimoishizaka et al. | |
| 2003/0146510 A1 | 8/2003 | Chien | |
| 2003/0193791 A1 * | 10/2003 | Panella | H01L 23/49805 361/764 |
| 2003/0194832 A1 * | 10/2003 | Lopata | H01L 23/50 438/108 |
| 2003/0197198 A1 * | 10/2003 | Panella | H05K 7/1092 257/200 |
| 2003/0202330 A1 * | 10/2003 | Lopata | H01L 23/50 361/760 |
| 2005/0082665 A1 * | 4/2005 | Martino | H05K 7/1053 257/727 |
| 2005/0110160 A1 | 5/2005 | Faroog et al. | |
| 2005/0161797 A1 | 7/2005 | Miller | |
| 2006/0038272 A1 | 2/2006 | Edwards | |
| 2006/0043567 A1 | 3/2006 | Palanduz | |
| 2006/0141667 A1 | 6/2006 | Milbrand et al. | |
| 2009/0108441 A1 | 4/2009 | Barr et al. | |
| 2010/0246152 A1 * | 9/2010 | Lin | H01L 24/92 361/783 |
| 2011/0147911 A1 | 6/2011 | Kohl et al. | |
| 2011/0147917 A1 * | 6/2011 | England | H01L 23/3677 257/692 |
| 2011/0163391 A1 * | 7/2011 | Kinzer | H01L 23/5389 257/401 |
| 2013/0155796 A1 | 6/2013 | Sugawara | |
| 2013/0242500 A1 * | 9/2013 | Lin | H01L 24/06 361/679.32 |
| 2014/0035093 A1 * | 2/2014 | Pincu | H01L 23/544 257/506 |
| 2014/0035106 A1 | 2/2014 | Vu et al. | |
| 2014/0084427 A1 | 3/2014 | Gaskins | |
| 2016/0190113 A1 * | 6/2016 | Sharan | H01L 25/16 257/531 |
| 2017/0363823 A1 * | 12/2017 | Mentovich | G02B 6/4206 |
| 2018/0158800 A1 * | 6/2018 | El-Mansouri | H01L 25/0657 |
| 2019/0157152 A1 * | 5/2019 | Sharan | H01L 25/16 |
| 2020/0066677 A1 * | 2/2020 | Bhagavat | G06F 1/26 |

OTHER PUBLICATIONS

"International Search Report and Written Opinion for PCT Application No. PCT/US18/041090, dated Sep. 19, 2018."

"International Search Report and Written Opinion for PCT Application No. PCT/US18/45519, dated Oct. 26, 2018."

Schreiber, Ron , "Wafer-Scale Processors: The Time Has Come", Cerebras,, https://www.cerebras.net/wafer-scale-processors-the-time-has-come/.

* cited by examiner

200

Providing a Semiconductor Substrate S210

Identifying a Largest Square S215

Fabricating Circuitry Layers S220

Providing Self-Correcting Mechanisms S222

Providing a Protective Barrier S225

Fabricating Inter-Die Connections S230

Semiconductor Substrate Reduction S240

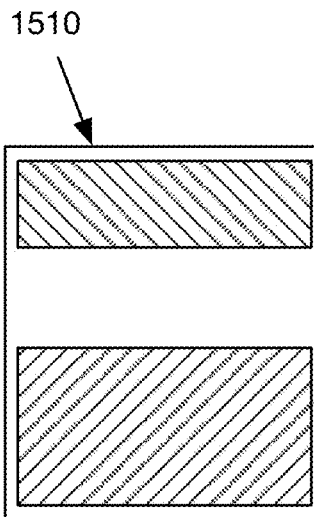
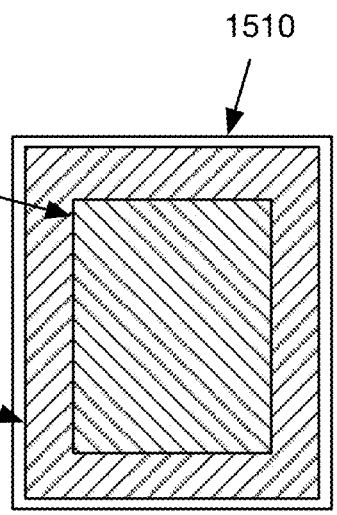
FIGURE 15A  FIGURE 15B
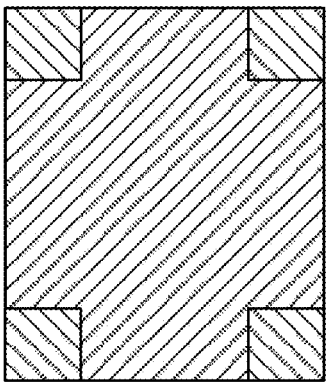
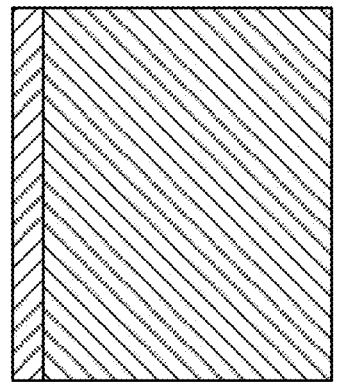
FIGURE 15C  FIGURE 15D
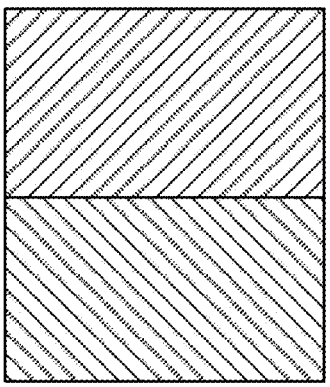
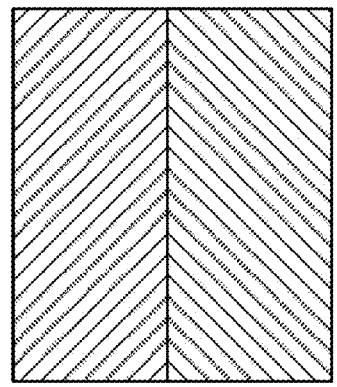
FIGURE 15E  FIGURE 15F

US 10,840,216 B2

SYSTEMS AND METHODS FOR POWERING AN INTEGRATED CIRCUIT HAVING MULTIPLE INTERCONNECTED DIE

CROSS-REFERENCE TO RELATED APPLICATIONS

This application claims the benefit of U.S. Provisional Application No. 62/813,889, filed 5 Mar. 2019, which is incorporated in its entirety by this reference.

This application is related to U.S. application Ser. No. 16/019,882 filed 27 Jun. 2018, U.S. application Ser. No. 16/029,207 filed 6 Jul. 2018, and U.S. application Ser. No. 16/056,792 filed 7 Aug. 2018, each of which is incorporated in its entirety by this reference.

TECHNICAL FIELD

The inventions described herein relate generally to the integrated circuit architecture and fabrication fields, and more specifically to a new and useful integrated circuit architecture and integrated circuit manufacturing methods in the integrated circuit architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algorithms, recurrent neural networks algorithms, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

BRIEF DESCRIPTION OF THE FIGURES

FIG. 15A-F are example arrangements of the first and second region on the broad face of the power component.

DESCRIPTION OF THE PREFERRED EMBODIMENTS

Figure 1:
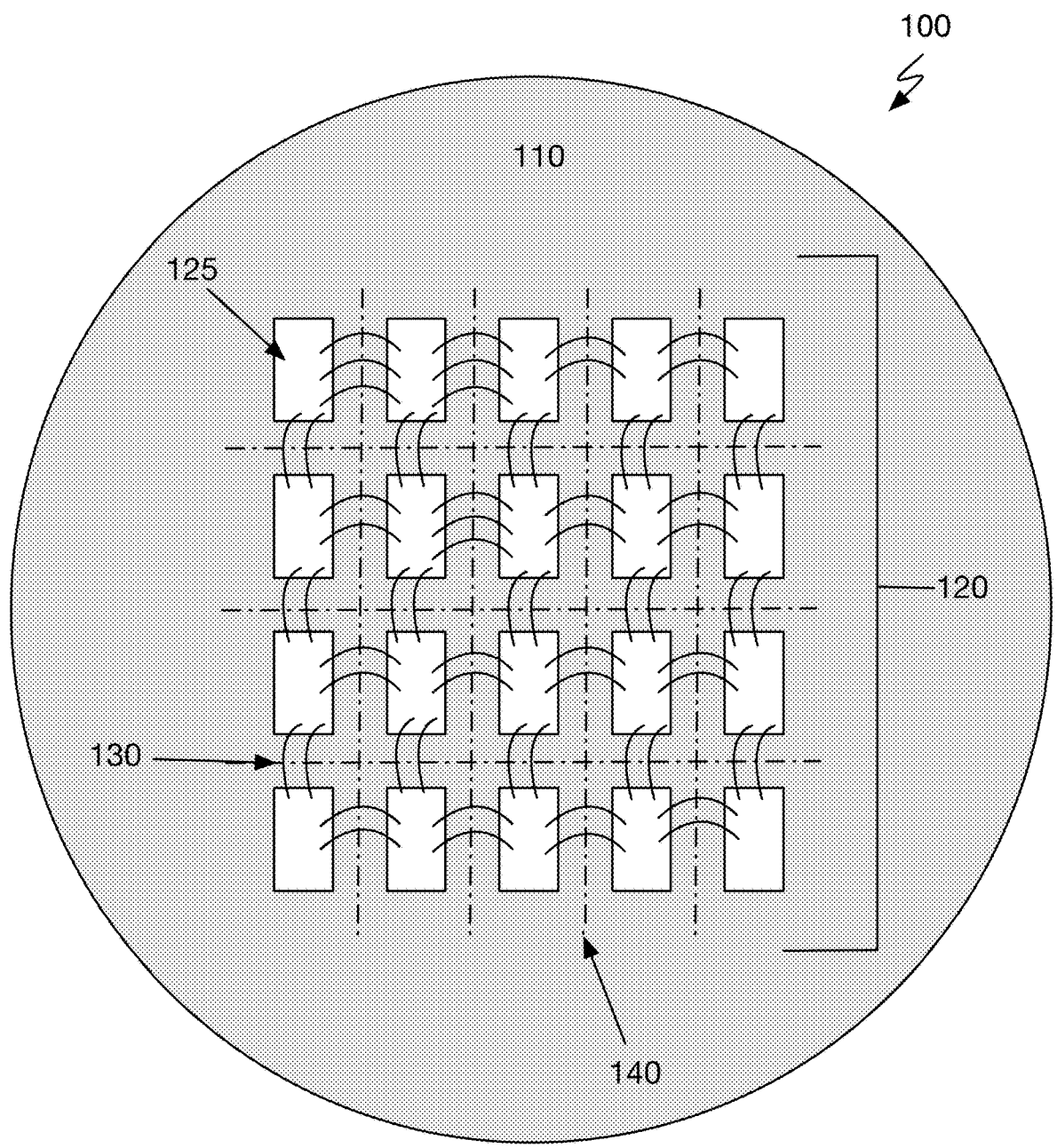
FIG. 1 illustrates a schematic of a system 100 in accordance with one or more embodiments of the present application.

The following description of the preferred embodiments of the invention is not intended to limit the invention to these preferred embodiments, but rather to enable any person skilled in the art to make and use this invention.

1. Overview 1.1 Die Connectivity

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. The communication connections between the chips may typically be found in the PCB. However, when a multi-chip PCB is manufactured in this manner, the communication between disparate chips thereon becomes limited by the amount connectivity or bandwidth available in each connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer, a continuous substrate) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, several technical problems relating to operational yield of the die on the large chip, packaging of the large chip, and powering/cooling of the large chip must also be solved. U.S. patent application Ser. No. 16/029,207 filed 6 Jul. 2018, which is incorporated by reference herein in its entirety describes technical solutions to these related technical problems.

1.2 Packaging and Coefficient of Thermal Expansion Mismatch

As alluded to in section 1.1, the fabrication of multiple die on a single substrate or wafer produces a very large die or resulting computer chip. While the connectivity of the multiple die to form a single large die on a single substrate and improved bandwidth across the substrate may be achieved according to the technical solutions described in U.S. patent application Ser. No. 16/029,207 filed 6 Jul. 2018, the very large size of the resulting die then gives rise to many technical issues at the system level when packaging the very large die to a PCB, panel, or an organic substrate.

The embodiments of the present application, therefore, also provide a system and method for enabling large silicon die, like those described in section 1.1 and beyond, to be used in PCBs or organic substrates having a non-compliant coefficient of thermal expansion relative to the large silicon die.

The technical problem of CTE mismatch arises in the computer chip packaging process results from a difference in the CTE of silicon onto which an integrated circuit is fabricated and the CTE of the substrate (e.g., PCB) onto which the silicon is later attached. The mismatch in CTEs of the silicon and the PCB onto which the silicon is attached results in the expansion (when powered or heat applied) of the two materials at different rates, inducing mechanical stresses, which can lead to damage in the computer chip, usually while in use. This CTE mismatch can also occur in components arranged between the silicon and the main PCB, such as power converters. In traditional chip packaging, it is only a single silicon die with circuitry that is attached to a PCB at a time and the relatively small size of the single silicon die may produce a small or negligible expansion mismatch with the PCB that the single silicon die is attached to. For instance, to attach a single silicon die to a PCB, small microbumps are added to a surface of the single silicon die then the silicon die is affixed to the PCB. When the single silicon die and the PCB expand at different rates due to differences in CTE properties of the materials, the microbumps can typically elastically deform and absorb the small shearing forces produced by the different expansions of the PCB and the silicon die. By contrast, when the silicon die is very large (e.g., includes multiple die), the microbumps are not capable of managing the large differences in expansion of the large silicon die and the PCB and thus, the microbumps will become damaged or cracked due to the excessive displacement of the silicon die relative to the PCB.

Additionally, in the case of a small silicon die, the PCB material may be selected such that the disparity between the CTE of the silicon die and the CTE of the PCB are reduced sufficiently for compatibility.

However, the large size of the silicon die of several embodiments of the present application exacerbates the problem of CTE mismatch. In some instances, the large silicon die described herein may be up to eighty or more times larger than a single silicon die and thus, the expansion of such a large silicon die may be compounded and the resulting expansion mismatch with a PCB onto which the large silicon die is attached is similarly compounded. Additionally, because the large silicon die may be so great, there are currently no materials that may be selected and combined to form a PCB and achieve CTE compatibility with the CTE of the large silicon die.

To address at least these technical problems, embodiments of the present application provide a compliant connector that is disposed between the large silicon die and a PCB or other substrate. The compliant connector may be capable of conducting a signal through it while placed under pressure of the system and may also be malleable. The malleability of the compliant connector can allow for absorption of the shearing displacement between the large silicon die and the PCB. U.S. patent application Ser. No. 16/029,207 filed 6 Jul. 2018, which is incorporated by reference herein in its entirety describes technical solutions to these related technical problems.

1.3 Compliant Connector

As introduced in section 1.2, a large compliant connector may be preferable for establishing a connection between a large wafer and a corresponding PCB (or panel). Specifically, one embodiment of the described compliant connector (e.g., elastomeric connector) includes a large piece of silicon rubber that is malleable and having a plurality of conductive elements (e.g., conductive contacts) therein. The plurality of conductive elements in the compliant connector preferably contacts both the PCB and the wafer when the system when placed under a compression load thereby establishing signal connectivity between the PCB and the wafer.

The compression of the combination of the wafer, the elastomeric connector, and the PCB is preferably achieved over a large surface of the compression system; however, because the wafer is thin and may be composed of relatively delicate material, the application of the compression forces for establishing the signal connectivity and also, to secure together the wafer, the elastomeric connector, and the PCB must be carefully applied during assembly and further, maintained after the assembly of the integrated circuit. At least a uniform compression system is proposed by the embodiments of the present application to achieve a required overall system compression after assembly.

In related art or traditional assembly systems, there exist no such system designed for achieving this technical uniform compression. Rather, in traditional IC assemblies, a CPU is assembled to the motherboard by placing the CPU in a socket of the motherboard. Afterward, a large clamping structure may be used to apply a clamping force to maintain the position of the CPU within the motherboard and four screws and springs may be applied to secure the CPU to the motherboard around the periphery of the CPU. This traditional process is typically done under compression but the compression is only over particular surfaces of the motherboard and CPU system. A backing plate usually composed of a strong material, such as steel (or other strong metal), may be affixed to one side of the motherboard (or PCB) because as the system is clamped, the clamping forces generate large opposing compression forces onto specific sections of the IC assembly that causes the motherboard to bow. Accordingly, to compensate for the flexibility of the motherboard, a steel backing plate having significant height or thickness may be added to the system to support or prevent the motherboard from bowing. The backing plate has to extend outside the periphery of the IC to reach and accommodate the compressing screws and springs. The backing plate has to be stiffened, and therefore thickened, as the span of compressing screws is extended and/or as the IC size, and therefore IC perimeter, is increased. The backing plate, therefore, tends to add significant weight and size to the overall structure of the IC because of the thickness and frame width around the IC of the backing plate that is required to resist the clamping forces.

In the embodiments of the present application, because the wafer, elastomeric connector, and PCB are large, significant compression forces (e.g., up to 4 tons or more of compression) may be required to achieve proper assembly and maintained system compression. If a backing plate, as used in the traditional systems were implemented, the backing plate would bow greatly and thus, a significantly larger backing plate having double or more thickness in size than a traditional backing plate would be required to prevent the PCB and IC assembly from bowing. In addition to grossly overweighting the system and increasing the size of the system (e.g., height and area) of the system, such a large backing plate would make it difficult to power the integrated circuit as it would be difficult to provide a power supply structure through such a thick backing plate.

To address at least these technical problems, embodiments of the present application provide an assembly system that provides a substantially uniform compression force across the system (without introducing an overly thick backing plate), during an assembly step, and that further enables a continued uniform compression of the system after assembly of the integrated circuit that ameliorates the tensile forces acting on the PCB, that reduces the size and weight of the overall system, and that enables sufficient or ease of access to power the integrated circuit.

1.4 Power on Wafer

The amount of current that can be carried in chip architectures is often limited by an amount of copper in the cross-section of the path between the power component 1330 (such as a voltage regulator) and the high-power computer chip. In such instances, the inductance from the voltage regulator and the high-power computer chip is also defined by the distance between the voltage regulator (i.e., power converter) and the high-power computer chip (e.g., the load). Additionally, decoupling capacitors 107 may typically be placed in near proximity to the voltage regulator as well as in close proximity to the load to mitigate the high current transients (di/dt) requirements of the load.

When applied to a large power load (e.g., a large semiconductor wafer or the like), the amount of current load required for the large power load, such as a large wafer, becomes very large. This high current load requires large amounts of copper, which causes conventional PCBs to be excessively thick (e.g., more than 1 mm, 5 mm, or 10 mm thick). Such a high thickness PCB becomes untenable because of the increased cost of power-conducting metal (e.g., copper) and the limited capability to manufacture and/or use of the PCB in practical applications. For instance, the features (e.g., vias or through holes, etc.) required for typical PCBs that would have to be manufactured in such a thick PCB become too big (e.g., long) and may be limited or precluded because of aspect ratio requirements.

To address at least these technical problems, embodiments of the present application provide configurations in which a power component (e.g., a voltage regulator/converter) is directly attached to the computer chip or semiconductor wafer (hereinafter "wafer"), which enables a direct powering of the computer chip with minimal inductance and capabilities to provide high current. In some variants, the power component is arranged between the substrate and the PCB to minimize the distance (e.g., wiring distance) and amount of wiring between the PCB and the power component. In some variants, the amount of copper (e.g., within the system, within the PCB) can be further reduced by routing power from the backside of the PCB (e.g., opposing the wafer), through the thickness of the PCB, to the power component.

Variations of this technology can confer any suitable set of benefits and/or advantages.

First, variations of this technology can enable power distribution to a wafer-scale processor and/or large integrated circuit by minimizing the amount of copper (or other conductive material) required. In these variants, the length and/or cross sectional area of conductive pathways can be minimized by arranging the power converter between the PCB and the wafer-scale processor where the load is applied, which improves manufacturability of the PCB, reduces overall manufacturing/assembly cost, and reduces the inductance resulting from the applied load.

Second, variations of this technology can enable power distribution to a wafer-scale processor and/or large integrated circuit by directly cooling heat-generating components, such as the power converter and/or wafer-scale processor. In some variants, an active cooling system can cool the power converter with a cooling fluid line extending through the PCB thickness, which can simplify the assembly and/or reduce the total amount of tubing required to access the power converter(s) arranged between the PCB and the wafer-scale processor. Additionally, some variants can utilize a compression element (e.g., elastomeric layer) and/or a thermal interface material (TIM) in order to ensure thermal contact (e.g., low thermal resistance, no air gap along thermal interface, etc.) at the heat generating components, despite the large area of the PCB, CTE mismatch between one or more components, and/or other factors.

Third, variations of this technology can enable power distribution to a wafer-scale processor and/or large integrated circuit by accommodating for different CTE across different components of the assembly. In such variants, compliant connections can mitigate the effects of fluctuating stress and/or fatigue in assembly components resulting from CTE mismatch, and additionally allow the system to be tolerant of slight manufacturing deviations in the surface flatness of one or more rigid components (e.g., PCB).

However, the technology can confer any other suitable set of benefits.

2. An IC with Inter-Die Connections and a Compliant Connector Assembly 2.1 IC with Inter-Die Connections As shown in FIG. 1, a semiconductor 100 illustrates an example integrated circuit having a substrate 110, a plurality of die 120 formed with the substrate 110, a circuit layer 125, a plurality of inter-die connections 130, and scribe lines 140.

The semiconductor 100 may be manufactured using any suitable lithography system that is configured to implement the one or more steps of the methods described herein, including method 200. The semiconductor 100 is preferably a wafer-scale processor (e.g., a wafer-scale integration; very-large-scale integration; a large integrated circuit network that uses an entire silicon wafer to produce a single "super-chip", etc.), but can alternatively be a large integrated circuit (e.g., with one or more connected, un-singulated, or singulated die, die reticles, etc.) or be otherwise constructed.

The semiconductor 100 functions to enable inter-die communications between the plurality of die 120 formed with the single substrate 110. The inter-die connections 130 formed between adjacent die on the substrate 110 improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasedly faster communications and data processing between die when compared, at least, to communications between die not maintained on a same substrate (e.g., a same wafer). Each of the plurality of die 120 remain on the single substrate 110 and are not cut from the substrate 110 into individual dice for separate packaging into an individual computer chip. Rather, at formation, only excess die (e.g., die that are not provided with circuitry or inactive die) along a periphery of the substrate 110 are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate 110 and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate 110. That is, each inter-die connection 130 may be formed or provided to extend from a first dice to a second dice located on the substrate 110. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate 110.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate 110. When positioned in an interior of the substrate 110, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate 110.

Figure 2:
FIG. 2 illustrates a method 200 in accordance with one or more embodiments of the present application.
Figure 3A:
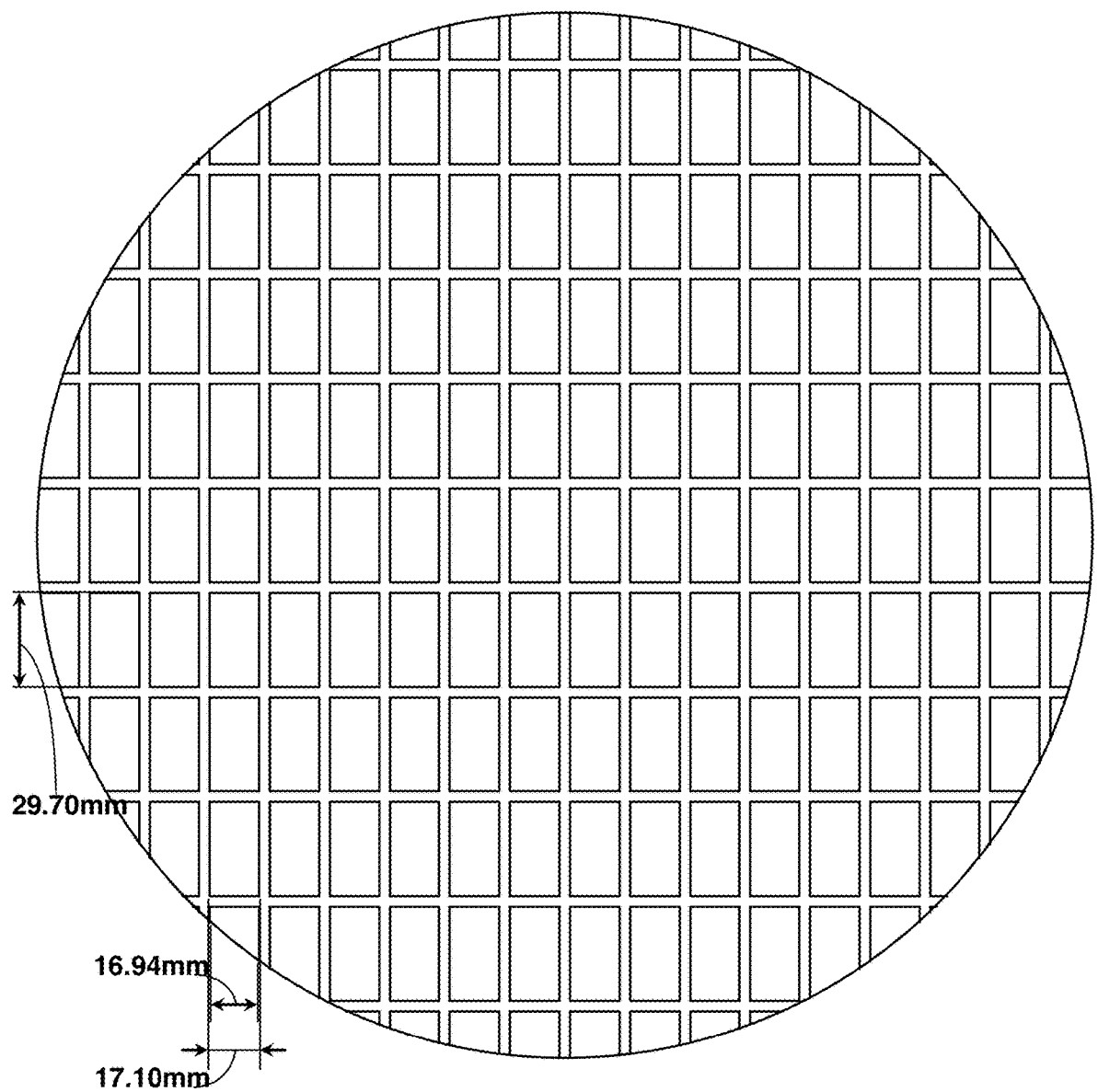
FIG. 3A-3D illustrate several schematics of a semiconductor substrate without and with interconnections in accordance with one or more embodiments of the present application.
Figure 3B:
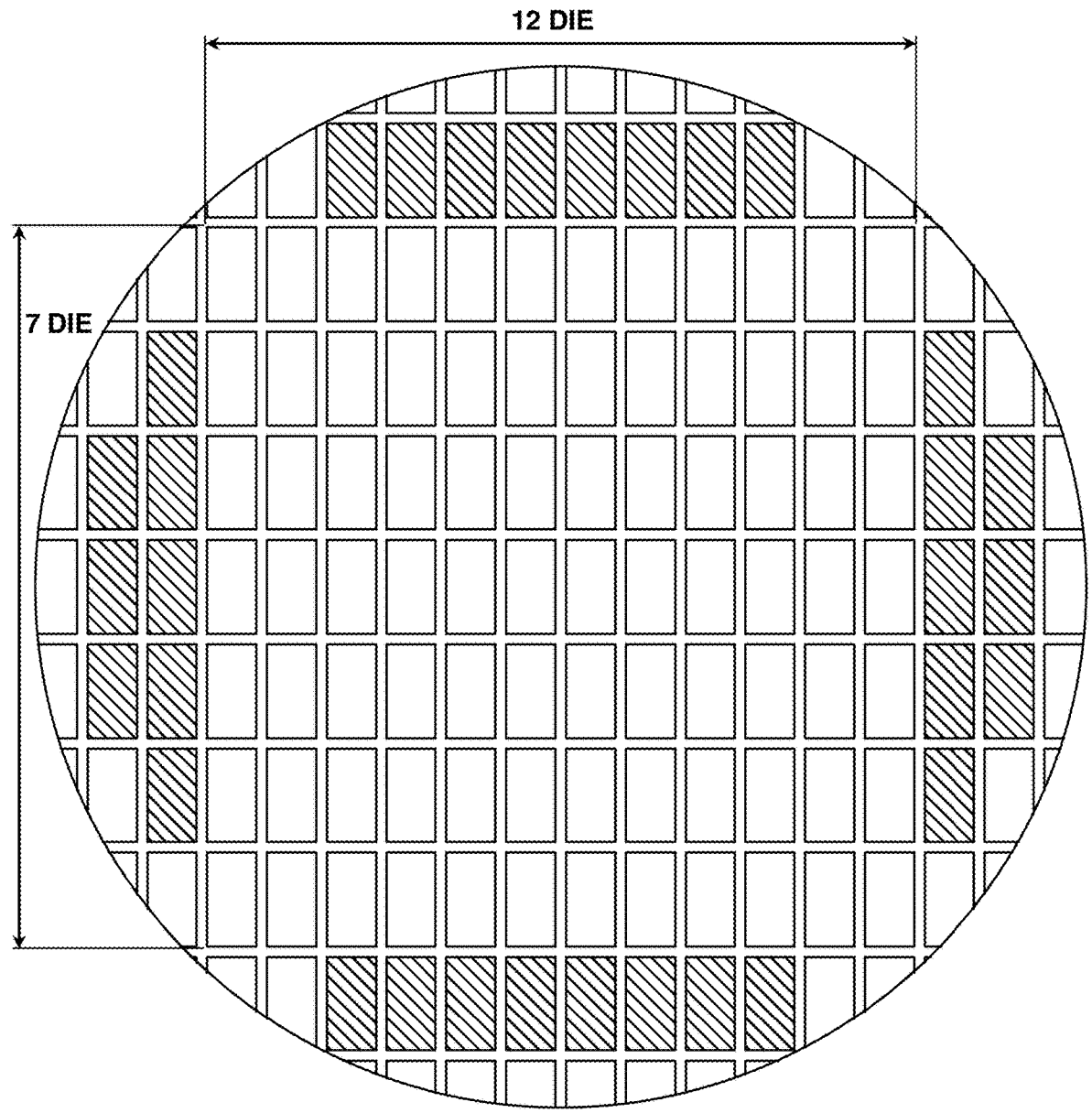
Figure 3C:
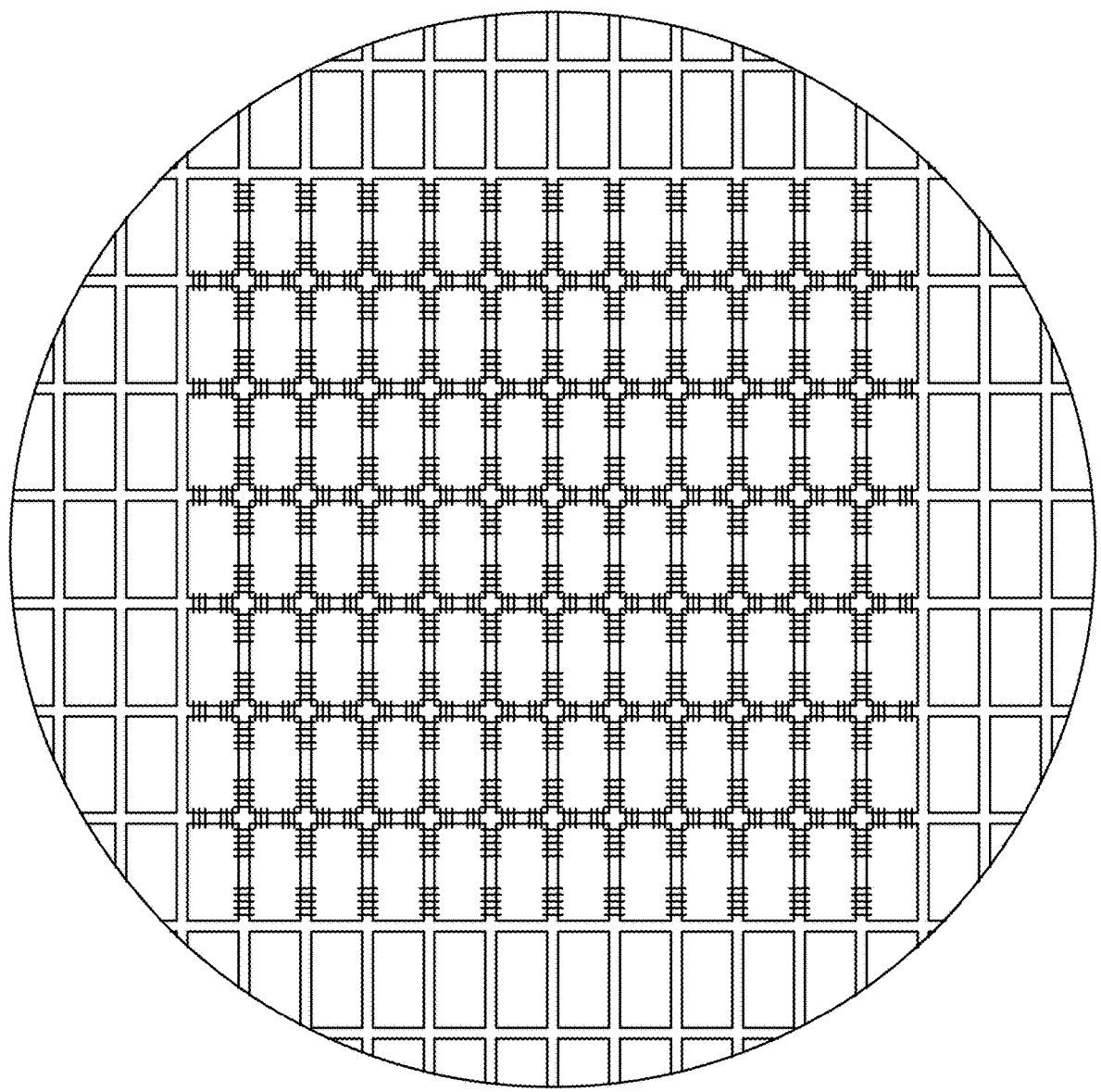
Figure 3D:
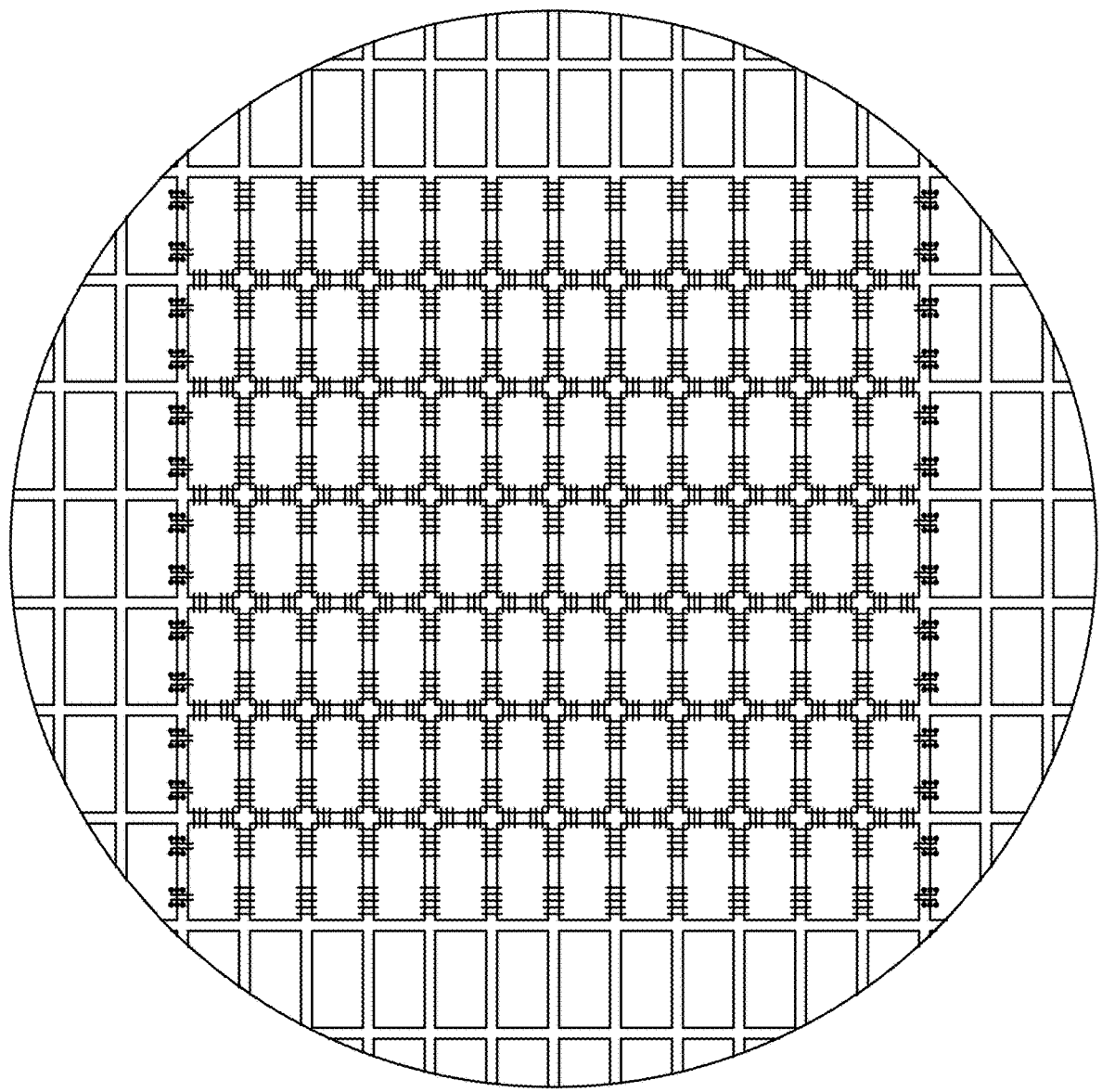
Figure 4A:
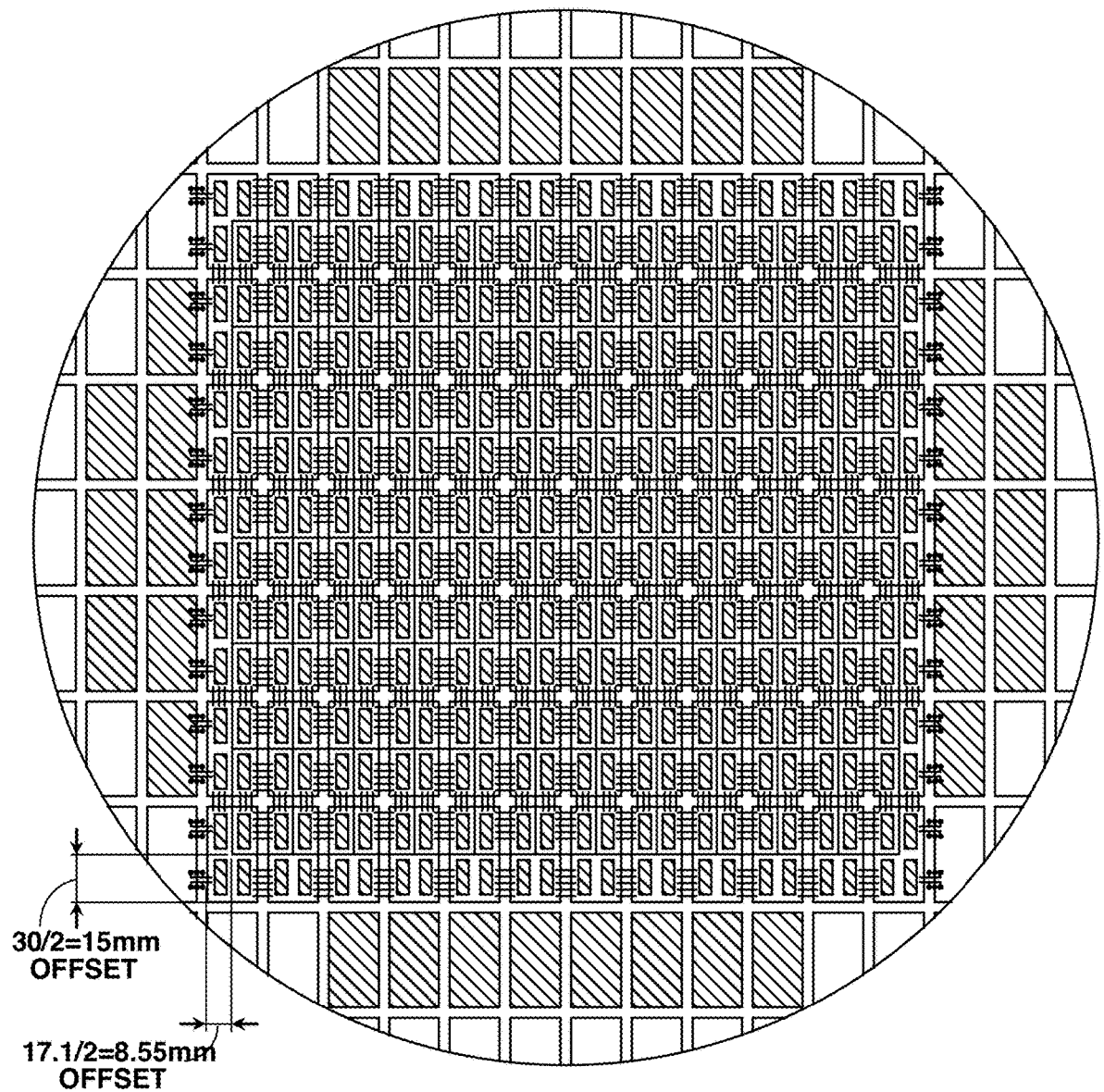
FIG. 4A-4D illustrate several schematics of a semiconductor substrate during exposure processes and size reduction in accordance with one or more embodiments of the present application.
Figure 4B:
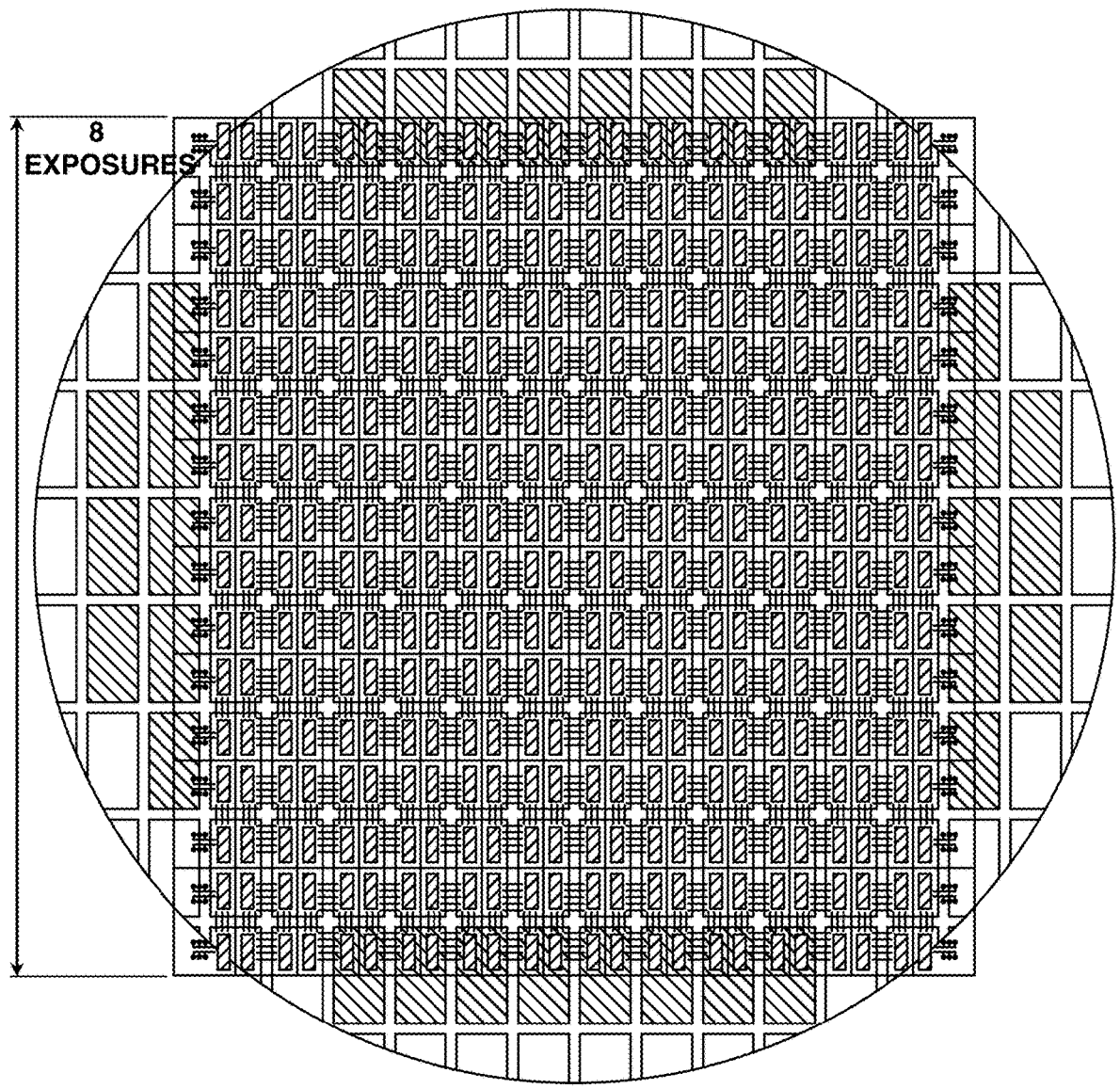
Figure 4C:
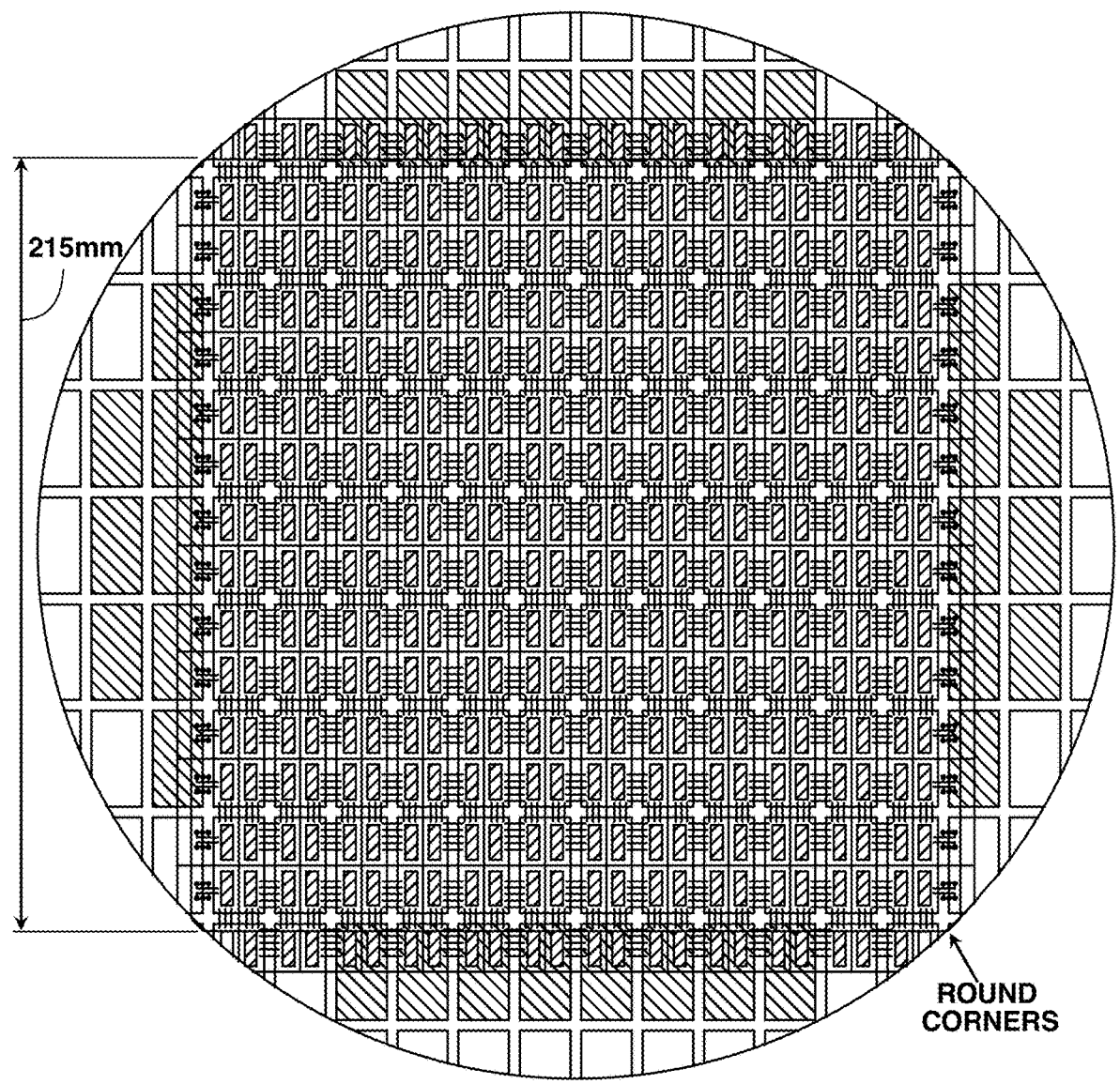
Figure 4D:
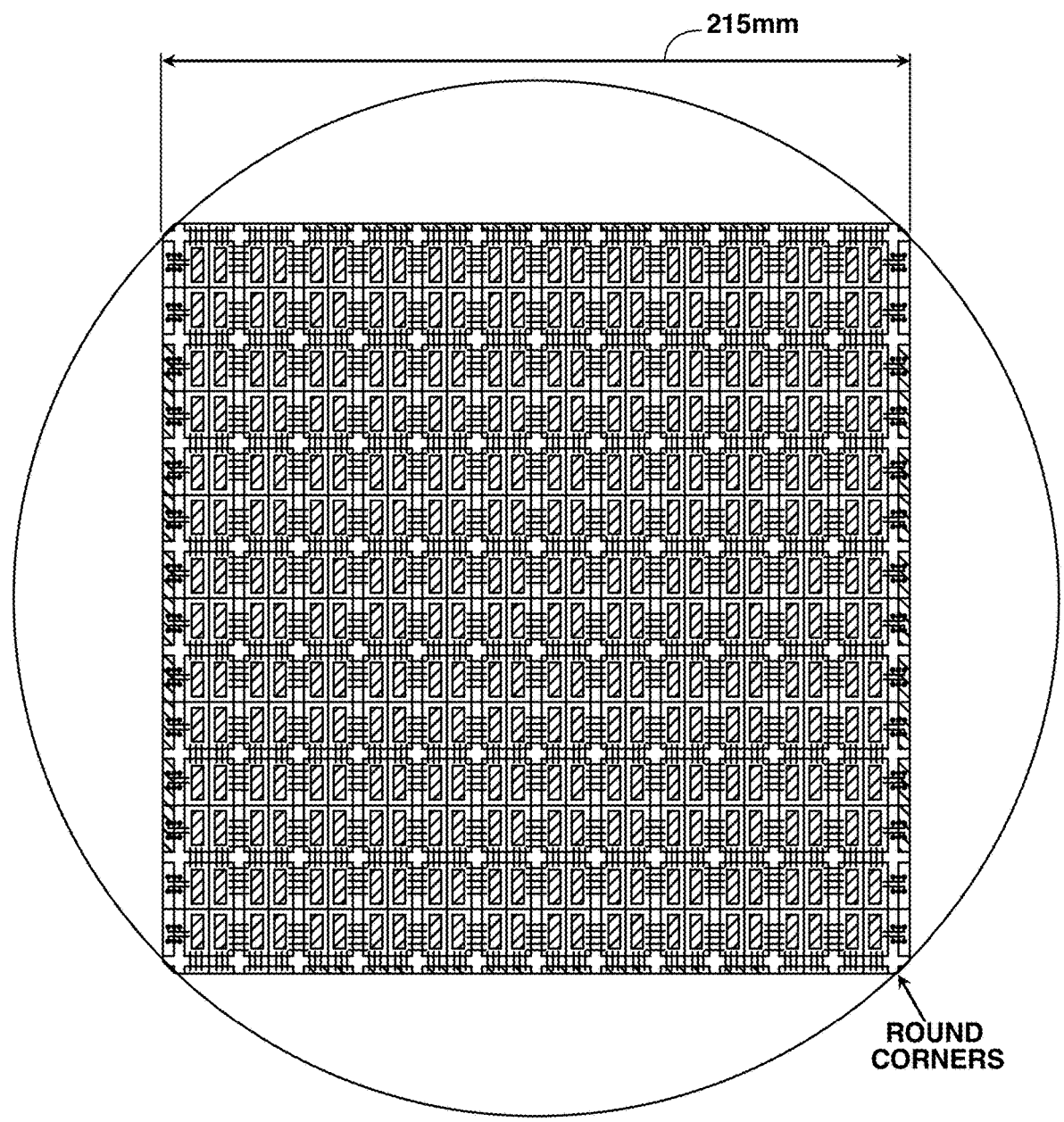

As shown in FIG. 2, a method 200 for producing a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215 and providing a protective barrier encompassing portions of the plurality of die S225.

Further, FIGS. 3A-3D illustrate several schematics of a semiconductor substrate, such as semiconductor 100, without and with interconnections. FIGS. 4A-4D illustrate several schematics of a semiconductor substrate, such as semiconductor 100, during exposure processes and size reduction.

2.2 Compliant Connector Assembly

Figure 5:
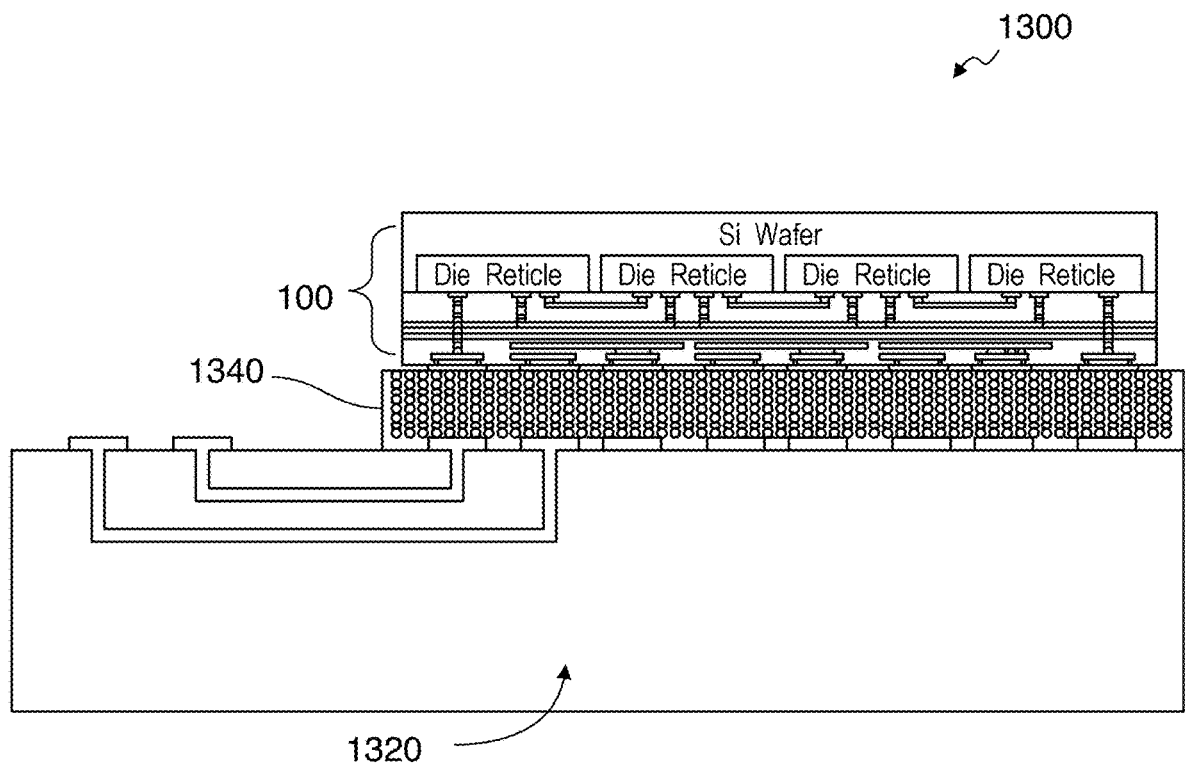
FIG. 5 illustrates a semiconductor assembly in accordance with one or more embodiments of the present application.

As shown in FIG. 5, a schematic of a semiconductor assembly includes an electrical connector 1340 disposed between the semiconductor 100 and a circuit board 1320.

The electrical connector 1340 functions to electrically connect the semiconductor 100 to a circuit board 1320 (e.g., PCB), and can optionally secure the large semiconductor 100 to a circuit board, function as the compression element (e.g., in variants of the compliant connector including a membrane 620), or perform other functionalities. The electrical connector is preferably compliant, but can additionally or alternatively be stiff or rigid. The compliant connector preferably functions to place the semiconductor 100 and circuit board in operable signal communication by conducting signals between them in a vertical direction (a direction normal to surfaces of both the semiconductor 100 and circuit board). Specifically, each of the semiconductor 100 and the circuit board may include one or more conductive pads 105. The conductive pads of the semiconductor 100 may generally oppose the conductive pads of the circuit board and may also, have a one-to-one alignment with each other. The compliant connector is preferably designed to be interposed between the opposing surfaces of the conductive pads of both the semiconductor 100 and the circuit board. In this way, signals provided by a conductive pad of either the semiconductor 100 or the circuit board may be transmitted through the elastomeric conductor to an opposite conductive pad of the other of the semiconductor 100 and the circuit board.

The compliant connector preferably conducts electricity (e.g., transmit power, signals, etc.) between a top and bottom component of the integrated circuit system stack (e.g., transmit power vertically), but can additionally or alternatively conduct electricity between adjacent components (e.g., transmit power laterally) or in any other suitable direction.

The electrical connector 1340 preferably extends along a portion of the PCB, substrate, or system component broad face, but can additionally or alternatively extend along the entirety, a minority, or majority of the respective component broad face. The system can include one or more compliant connectors. In a first variation, one or more compliant connectors extend along the conductive pad areas (e.g., include one compliant connector for each conductive pad, for each conductive pad connection, etc.). Each compliant connector can be sized: smaller than, larger than, the same size as, or otherwise sized relative to the conductive pads, the dies, the die reticles, the powered area, and/or any other suitable component. In a second variation, one or more compliant connectors extend between the conductive pads (e.g., forming lateral electrical connections).

The compliant connector can be operable between a first mode (e.g., uncompressed mode, relaxed mode, first state) and a second mode (e.g., compressed mode, second state). The compliant connector preferably does not electrically connect a first and second component (e.g., coupled to a first and second broad face of the compliant connector, respectively) in the first mode, and electrically connects the first and second component in the second mode, but can alternatively electrically connect the components in the first and second mode, or otherwise electrically connect (or isolate) the components. The compliant connector can be placed in the second mode by: a set of biasing mechanisms (e.g., springs), compression elements, fasteners, or any other suitable biasing mechanism. The compression force can be applied to: the power component, the wafer, the PCB, the first end of the compliant connector, the second end of the compliant connector, or any other suitable component.

Figure 6A:
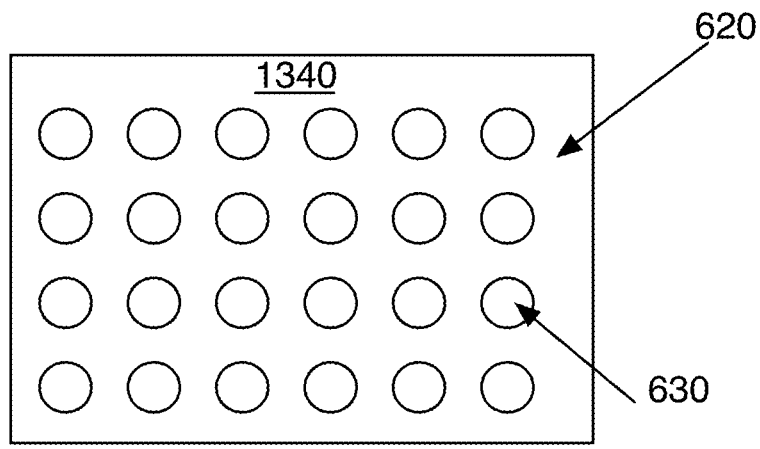
FIG. 6A-6B illustrate schematic examples of a compliant connector in accordance with one or more embodiments of the present application.

The compliant connector can include a plurality of conductive elements 630 (an example is shown in FIG. 6A), but can alternatively include a single conductive element 630 or any other suitable number of conductive elements.

Examples of the conductive elements 630 include: ball wires, conductive particles, springs, wire or metal strips, or any other suitable flexible, conductive element. Examples of materials that can be used for the conductive elements 630 include: metals (e.g., copper, gold, silver, etc.), carbon structures (e.g., carbon nanotubes), or other conductive materials.

Each conductive element 630 can be individually packaged, embedded or suspended in a compliant substrate (e.g., membrane, the compression element 1350, etc.), or otherwise packaged. The compliant substrate is preferably electrically insulative, but can be electrically conductive. Each conductive element 630 can be electrically insulated along the length of its exterior and electrically conductive along its ends, but can alternatively be electrically conductive along the length of its exterior, or otherwise electrically conductive or insulated.

The plurality of conductive elements 630 may be any suitable conductive material that are arranged distributively and/or separately arranged within a body of the membrane 620. The plurality of conductive elements can include a plurality of particles, such as ball wires, conductive balls, or conductive filler, that can be electrically and/or physically isolated from adjacent particles when in a relaxed state, and come into conductive contact with adjacent particles when placed under compression (e.g., vertical compression).

Figure 6B:
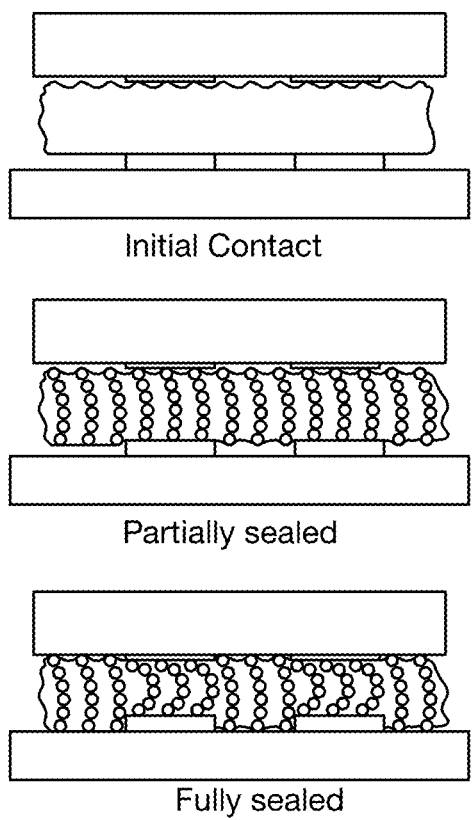

That is, in a first state (of un-compression) in which the compliant connector is not placed under a compressive load, the plurality of conductive elements 630 are preferably distributed within the body of the membrane 620 substantially (some contact) or fully independent (no contact) of each other. However, in a second state (of compression) in which the compliant connector is placed under a compressive load, the plurality of conductive elements 630 preferably come into contact and may function to form multiple disparate conductive chains (conductive strings) or electrical paths from a first surface region of the compliant connector to a second surface region (preferably opposing surface region) of the compliant connector that function to electrically connect the conductive pads of the semiconductor 100 and the conductive pads at the circuit board. As shown in FIG. 6B, when under compression, the plurality of conductive elements 630 only make contact vertically and not horizontally. However, it shall be noted that if a laterally compressive force were applied to the compliant connector, the plurality of conductive elements 630 would similarly come into contact to form an electrical signal path between the opposing surface regions of the compliant connector.

The plurality of conductive elements 630 may, additionally, function to provide an elastic effect or spring effect in one or more portions of the compliant connector to generally resist compressive forces, shearing forces, and/or permanent deformations in the compliant connector. Accordingly, when one or more portions of the compliant connector is placed under a load, the plurality of conductive elements 630 may elastically compress without allowing the compliant connector to undergo permanent deformation. That is, even after a large load (e.g., four tons of pressure or the like) the plurality of conductive elements 630 are sufficiently elastic to allow the compliant connector to regain its original form or substantially its original form when the compliant connector is not placed under the large load.

In the case that the plurality of conductive elements 630 comprise metal ball wires, the elastic effect is achieved when a load is placed onto the compliant connector thereby causing the ball wires to come into conductive and elastic contact with each other. The ball wires when in contact form a substantially vertical conductive path (or in some embodiments, a lateral conductive path), as shown by way of example in FIG. 6B. Additionally, or alternatively, a vertical spring or elastic chain in which the adjacent ball wires forming the vertical conductive path and spring may be permitted to slide against each other in a horizontal direction (e.g., in a direction normal to a direction of a load) and in the vertical direction (albeit slightly) while maintaining continuous contact. In some embodiments, adjacent surfaces of the ball wires, when in contact, are permitted to slide against each other in the conductive and elastic path allows the conductive and elastic path to shift (while maintaining conductive and elastic contact) and form an arc. The arc formed by the ball wires while under a compressive load may have varying radii along the arc. Additionally, the arcs formed by horizontally adjacent vertical conductive and elastic paths may have similar or different arcs depending on an amount of load applied thereon.

The arc-shaped configuration of the ball wires when placed under a compressive load preferably allows for significant deformation (e.g., beyond some deformation threshold) of the compliant connector while allowing the ball wires to maintain signal communication between the semiconductor 110 and the circuit board and also, allow the ball wires to elastically resist variable shearing forces along the compliant connector by allowing radii along the signal conductive path or conductive chain formed thereby to shift or change according to varying shearing forces applied to the various sections of the signal conductive path. That is, because the semiconductor 100 may expand or contract at a different rate than the circuit board, shearing forces experienced along top portion or region of the compliant connector may be different than the shearing forces experienced along a bottom portion or region of the compliant connector. Accordingly, the resulting shearing forces experienced along the signal conductive path formed by the plurality of ball wires (e.g., the plurality of conductive elements) may also vary from a top region to a bottom region of the compliant connector.

Further yet, the plurality of conductive elements 630 while under compression and while maintaining conductive contact function to enable a shearing force absorption effect while maintaining signal conductivity between the semiconductor 100 and the circuit board. A shearing effect or shearing force against the compliant connector may generally be caused by a disparity between the CTE of the circuit board and the semiconductor 100. The semiconductor 100 being preferably made of silicon material typically may not vary greatly, in terms of expansion (expands approximately at 3 parts per million) or contraction, during heating or cooling. The circuit board, however, which may include materials such as copper may expand and contract at a different rate (e.g., 17 parts per million). Of course, because the semiconductor 100 is large the corresponding circuit board is large so that a heating effect (when powered) applied to the assembly may mainly causes the circuit board to expand so greatly relative to the semiconductor 100 on the opposite side of the compliant connector to cause to a large shearing force and resulting shearing effect on the connector.

However, as mentioned above, the configuration of the ball wires (e.g., roundness or substantial roundness) allows the balls to shift or slide against each other and thereby absorb and resist the shearing force caused due to the heating of the circuit board and the semiconductor with mismatched CTEs.

3. Direct Attachment of Power on Wafer (PoW)

Figure 13:
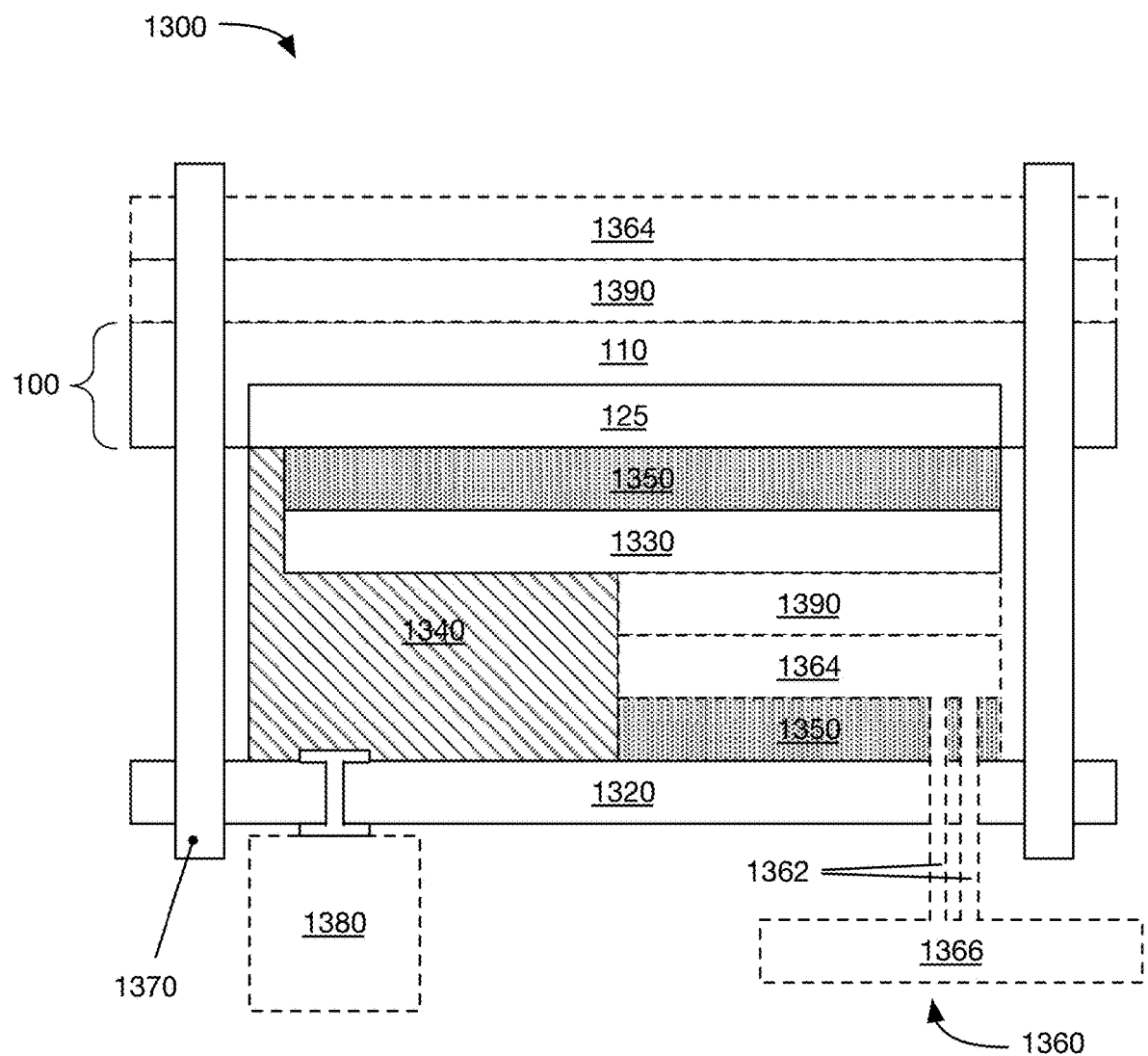
FIG. 13 is a cross section view of an example architecture for powering an integrated circuit.
Figure 14:
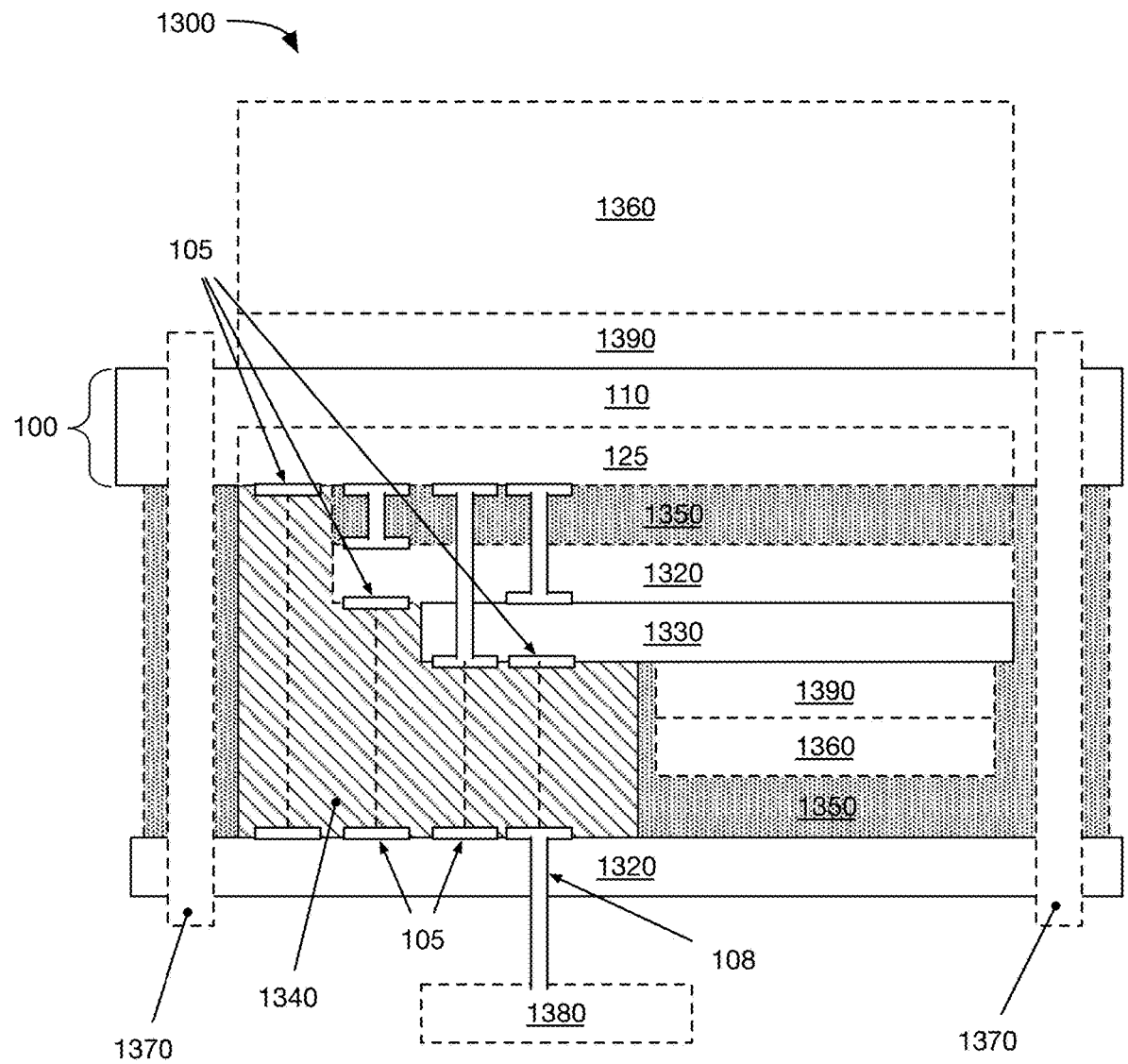
FIG. 14 is a cross section view of an example architecture for powering an integrated circuit.
Figure 16:
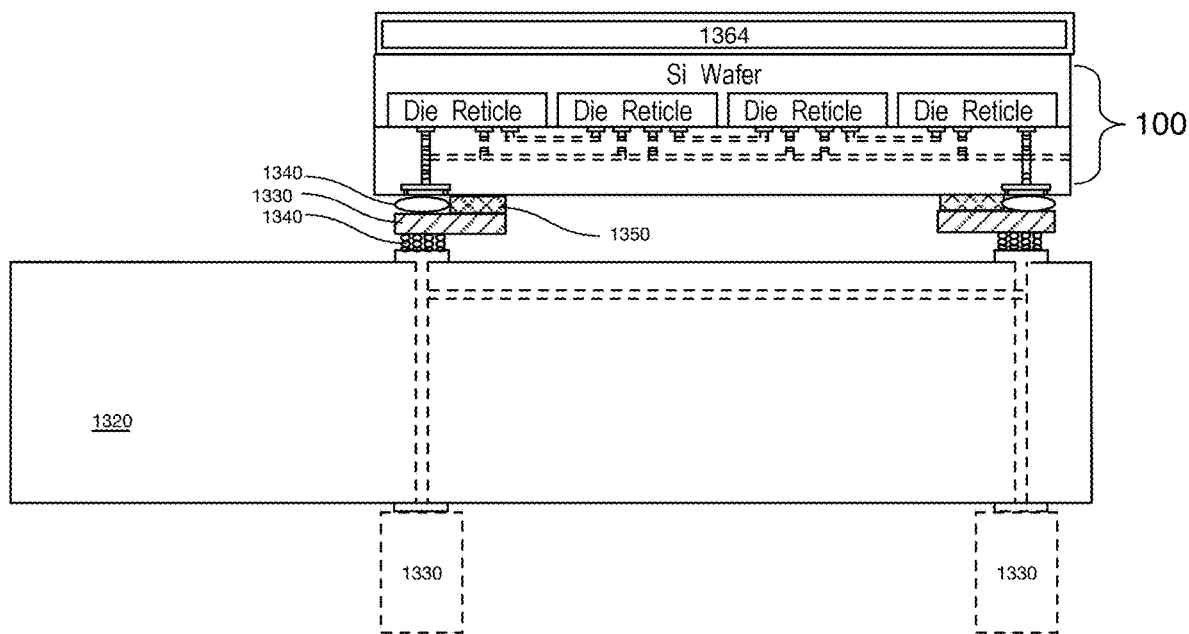
FIG. 16 is a cross section view of an example architecture for powering an integrated circuit which includes a rigid electrical connector between the wafer and the power component.

The power on wafer assembly 1300 can include a compliant connector, an integrated circuit 100, a printed circuit board (PCB) 1320, a power component 1330, and an electrical connector 1340. The power on wafer assembly can optionally include: a compression element 1350, a cooling system 1360, a set of mechanical clamping components 1370, a power source 1380, and a thermal interface material (TIM) 1390. An example of the power on wafer assembly is shown in FIG. 13 and FIG. 14. However, the power on wafer assembly can additionally or alternately include any other suitable components.

Figure 8:
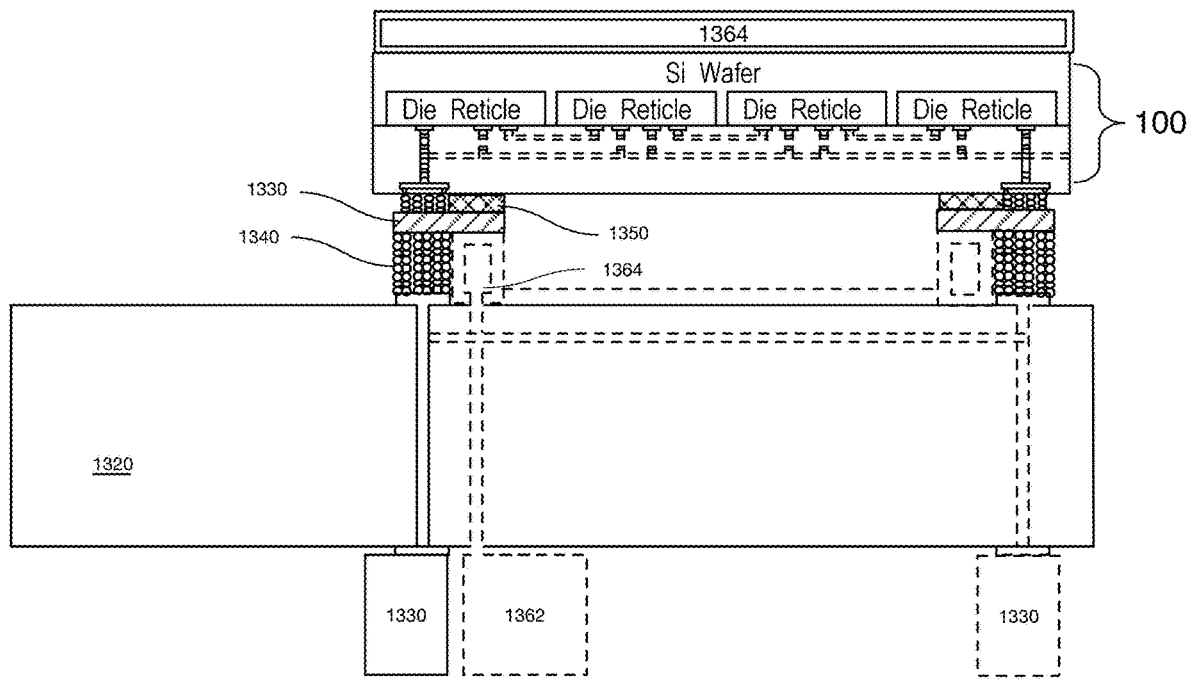
FIG. 8 is a cross section view of an example architecture for powering an integrated circuit.

The integrated circuit 100 includes a semiconductor substrate 110 having a plurality of interconnected die 120 formed within the semiconductor substrate 110 (similar to substrate 110)—an example is shown in FIG. 8. One or more power components 1330 may be directly attached or assembled to a surface of the semiconductor substrate. The integrated circuit is preferably a wafer-scale processor, semi-conductor wafer, can have any appropriately size/geometry. The integrated circuit is preferably rectangular (or square) with side lengths which can be: <25 mm, 50 mm, 75 mm, 100 mm, 125 mm, 150 mm, 175 mm, 200 mm, 215 mm, >215 mm, any range bounded by the aforementioned values, and/or any other suitable side length(s). In a specific variant, the integrated circuit can be the integrated circuit described in U.S. application Ser. No. 16/019,882 filed 27 Jun. 2018, which is incorporated in its entirety by this reference. However, the integrated circuit can be any other suitable integrated circuit, processor, chip, wafer, or other processing component.

The PCB 1320 preferably functions to control operation of the integrated circuit by distributing power, generating and sending signals to the integrated circuit, and/or receiving signals from the integrated circuit. Signals can be associated with individual die reticles, power components (e.g., driver, power converter), and/or other endpoints, or can be associated with a plurality of the aforementioned components. Signals and/or power can be passed along the PCB's internal planes, through the PCB thickness (e.g., using TSVs or other connections), or otherwise pass signals and/or power therethrough. The PCB can additionally or alternately function as a structural and/or clamping member to clamp one or more components against the integrated circuit in response to a tightening of the mechanical clamping components. The PCB can have an area equal to the integrated circuit, larger than the integrated circuit, smaller than the integrated circuit, and/or any other suitable area with the same geometry or a different geometry than the integrated circuit. The PCB preferably defines a first side (e.g., oriented towards the integrated circuit) and a second side (e.g., oriented away from the integrated circuit). The PCB can mount any suitable set of control components, power components, power sources, components of the cooling system, and/or other suitable components on the first side, second side, and/or mount any other suitable component. The PCB can mechanically support and/or electrically connect components via conductive tracks, pads, and/or other features etched from one or more sheet layers of copper laminated onto and/or between sheet layers of a non-conductive substrate. The PCB substrate can include the same or different material as the wafer substrate and can include: FR-2, FR-4, FR-5, aluminum, flexible substrate (Kapton, Pyralux, etc.), PTFE, G-10, G-11, and/or any other appropriate material.

The PCB preferably includes a set of conductive pads which function to transmit power and signals between various components/endpoints. The set of conductive pads can be arranged on the first side and/or second side of the PCB. The set of conductive pads can be electrically connected to the power source and/or wafer by the electrical (e.g., compliant) connector(s). The PCB can include any suitable number of conductive pads associated with each die reticle such as: one conductive pad per die reticle, multiple conductive pads per die reticle, multiple die reticles per conductive pad, and/or other suitable arrangement of conductive pads. The PCB can include any suitable number of conductive pads associated with each power component (e.g., power converter, voltage regulator, etc.) such as: one conductive pad per power component, multiple conductive pads per power component, multiple power components per conductive pad, and/or other suitable arrangement of conductive pads.

The PCB preferably includes an electrical pathway connecting the power source and the set of conductive pads, which functions to deliver high voltage/low current power (relative to the integrated circuit power) to the power component(s). The electrical pathway can extend along a layer of the PCB, through a thickness of the PCB, along a layer of the PCB, and/or be otherwise arranged. Preferably, the electrical pathway includes a through silicone via (TSV) 108, but can alternately be etched, bonded, and/or otherwise fabricated into the PCB or otherwise connected. There can be any suitable number of conductive pathways associated with each conductive pad on the PCB, such as: one conductive pathway per conductive pad, multiple conductive pathways per conductive pad, multiple power conductive pathways per conductive pad, and/or other suitable arrangement.

The PCB can optionally include (e.g., define) a fluid pathway, which can extend through the PCB thickness, along one or more layers of the PCB, and/or be otherwise arranged. The fluid pathway preferably extends through an aperture or cavity in the PCB, but can additionally or alternatively connect to a cooling component 1364 mounted to the PCB and/or be otherwise implemented.

The power component 1330 functions to provide power (e.g., wafer power, wafer-compatible power) to the wafer (e.g., one or more die reticles). The power component can include: a power converter, a voltage regulator, current transformer, a rectifier, driver (e.g., a circuit or component that controls power conversion), power supply, a combination thereof, and/or any suitable power component capable of powering one or more components of a computer. The power component can be packaged in a single package, multiple packages, or otherwise packaged.

In a specific example, the power component includes a voltage regulator that may be arranged to provide power on the semiconductor substrate 110. In a second specific example, the power component includes a voltage regulator, current transformer, and a driver. In a third specific example, the power component includes any suitable AC/DC or DC/DC converter such as a: rectifier, diode rectifier, voltage regulator, linear regulator, step-up converter, step-down converter, buck converter, boost converter, multi-phase converter, and/or any other appropriate power converter(s).

The power component(s) can accept any suitable AC and/or DC input voltage, such as: 12-54 VDC, 110 VAC, 120 VAC, >54 VDC, 9V, 6V, 5V, 4.8V, 2.4V, 1.8V, any suitable range defined therein, and/or any other appropriate range of inputs. The power component can output any suitable voltage, such as 0.9 VDC or 0.8 VDC, 1.8 VDC, and/or any other appropriate output voltage.

Figure 9:
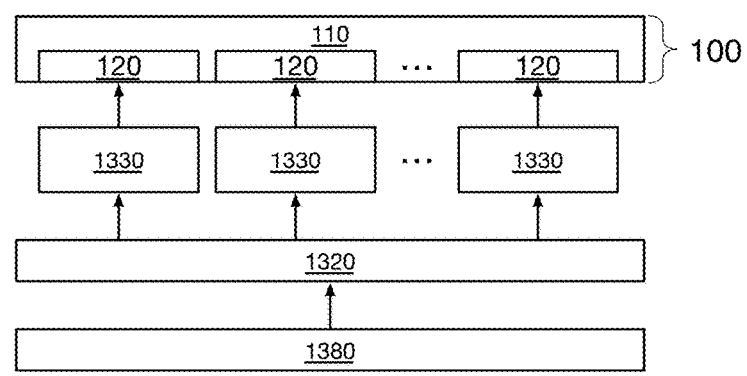
FIG. 9 is a schematic representation of an example architecture for powering an integrated circuit.

The assembly can include any suitable number of power components, such as a unitary power converter for the integrated circuit, a plurality of power components for the integrated circuit (e.g., one power component per die, on power component associated with a plurality of die, multiple power components per die, etc.) such as in the example shown in FIG. 9, and/or other suitable number of power components.

Figure 17:
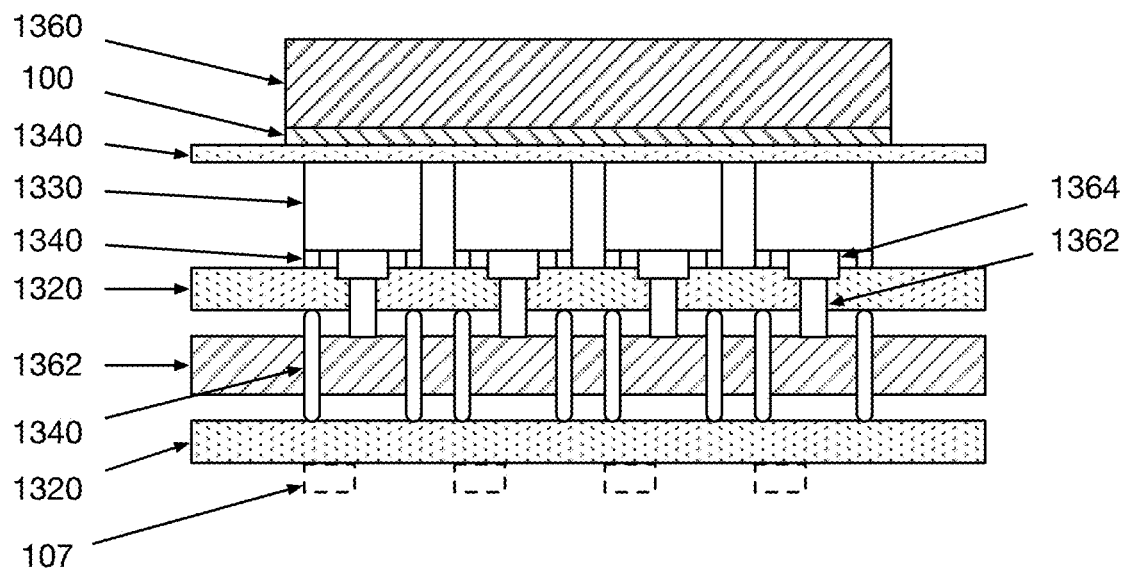
FIG. 17 is a cross section view of an example architecture for powering an integrated circuit which includes an intermediary PCB as the electrical connector between the wafer and the power component.

The power component 1330 is preferably arranged between the PCB and the semiconductor 100, but can be otherwise arranged. The power component 1330 is preferably mounted to and/or electrically connected to: the semiconductor (e.g., along a semiconductor 100 broad face proximal the PCB), more preferably to a die reticle (e.g., a conductive pad of the die reticle), but can alternatively be mounted to another portion of the semiconductor broad face, to the PCB, or to any other suitable component. The power component 1330 can be mounted (e.g., structurally connected) and/or electrically connected by: the compliant connector, solder (e.g., SMT, solder, ball grid array, etc.), pins (e.g., pogo pins, through hole pins, SMT pins, etc.), an intermediary PCB (e.g., a passthrough PCB with no electrical connections along layers, one intermediary PCB per power component, one intermediary PCB for the semiconductor 100 or wafer, a PCB with only TSV electrical pathways, as shown in FIG. 17, etc.), a combination thereof (e.g., a compliant connector and an intermediary PCB), or any other suitable electrical connection. The electrical connection is preferably compliant (e.g., vertically compliant, compliant in shear, compliant along a plane parallel the PCB or wafer, etc.), but can additionally or alternatively be noncompliant.

When the system includes multiple power components 1330, each power component can be connected to the wafer (e.g., directly or indirectly): by a single electrical connection (e.g., a single compliant connector or a single intermediary PCB connecting multiple power components 1330 to the wafer), individual electrical connections (e.g., each power component 1330 is connected to the wafer by a different electrical connection, such as individual compliant connectors, individual intermediary PCBs, etc.), or otherwise connected to the wafer.

In a first variant, the power component(s) can be affixed and/or electrically attached to at least one surface of the semiconductor substrate 110. That is, in some embodiments, the semiconductor substrate 110 comprises an integrated circuit wafer with one or more active circuitry layers that may be affixed directly to one or more power components 1330 rather than a PCB substrate or panel. A technical advantage of one or more of such embodiments of the present application include a limited to very low inductance since the power component is positioned directly on the chip or integrated circuit wafer thereby reducing the distance from the power component to the chip and consequently, reducing the amount of conductive material, such as copper material, that is required. In the first variant, the conductive material extends directly from the power component 1330 to the load (i.e., the plurality of die formed in the semiconductor substrate 110) without having to travel through a PCB or other substrate, thereby significantly reducing the amount of conductive material required and associated inductance, as mentioned above.

Accordingly, in such variants, the semiconductor substrate 110 may be directly attached to and supported by the one or more power components, or vice versa. In some variants, the one or more power components can be affixed to the at least one surface of the semiconductor substrate 110 without the active circuitry layers of each of the plurality of die and/or at one or more different positions along the wafer including on a side of the wafer having the active circuitry layers.

In a first variant, the power components 1330 are mounted to the active circuitry layer-side of the wafer (e.g., aligned with the dies, aligned with a portion of the wafer outside of the die projection, etc.). In a first example of the first variant, one or more power components 1330 may be arranged or affixed along a peripheral border of the wafer surrounding a plurality of die on the wafer. In a second example of the first variant, one or more power components 1330 may be aligned with one or more die. In a second variant, the power components 1330 are mounted to a side of the wafer opposing the active circuitry layer and/or dies.

Additionally, or alternatively, each of the one or more power components may be electrically connected to the semiconductor substrate 110 using any suitable conductive material and/or method including, but not limited to, conductive c4 bumps or balls, BGA bulbs, and/or the like. Additionally, or alternatively, each of the one or more power components 1330 may be arranged in alignment with areas of the semiconductor substrate that consume power. In one embodiment, each power component 1330 may be arranged along the semiconductor substrate 110 such that there is one power component per die reticle. That is, each power component 1330 may be arranged to provide power to an area of a wafer that is defined by a size and/or shape of a die reticle that may be used to form a subset of the plurality of die 720 along the semiconductor substrate 110. In another embodiment, each power component 1330 can be arranged to and supply power to multiple die reticles. Additionally, or alternatively, each of the power components 1330 may be arranged to provide power depending on power domains. For instance, in some embodiments, one power component 1330 may be assigned or arranged to provide power to one power domain of a plurality of distinct power domains along the semiconductor substrate. It shall be noted, however, that any suitable arrangement of the power components may be achievable such that the power components provide power to more than one reticle area or power domain or such that more than one power component provides power to a single reticle area or a single power domain.

The power components within the system can be of the same or different type (e.g., power rating, power conversion type, etc.). Additionally, or alternatively, the power components arranged across a wafer or a large chip may be uniform or non-uniform. For instance, in the circumstance that the power consuming areas of a wafer or large chip are uniform, uniform power components having same attributes may be arranged along the wafer or large chip to provide power to each of the uniform regions thereof. Conversely, in some embodiments, a wafer or a large chip may include a number of distinctly sized power-consuming regions having different power consumption attributes. In such embodiments, a plurality of non-uniform power components, each having distinct power provisioning attributes may be arranged along the wafer or the large chip.

Additionally, or alternatively, in some embodiments, a power component may be partitioned or split into parts, such that at least a first part of the power component may be arranged on or affixed to the semiconductor substrate 110 and at least a second part arranged on a distinct substrate or PCB. In such embodiments, the first part of the power component may include a power transformer or power converter (plus rectifier) and the second part may include a voltage regulator or power controller/driver (e.g., power control board), as shown by way of example in FIG. 7. A technical advantage of such embodiments include reducing a size of the power component on the integrated circuit wafer.

Figure 7:
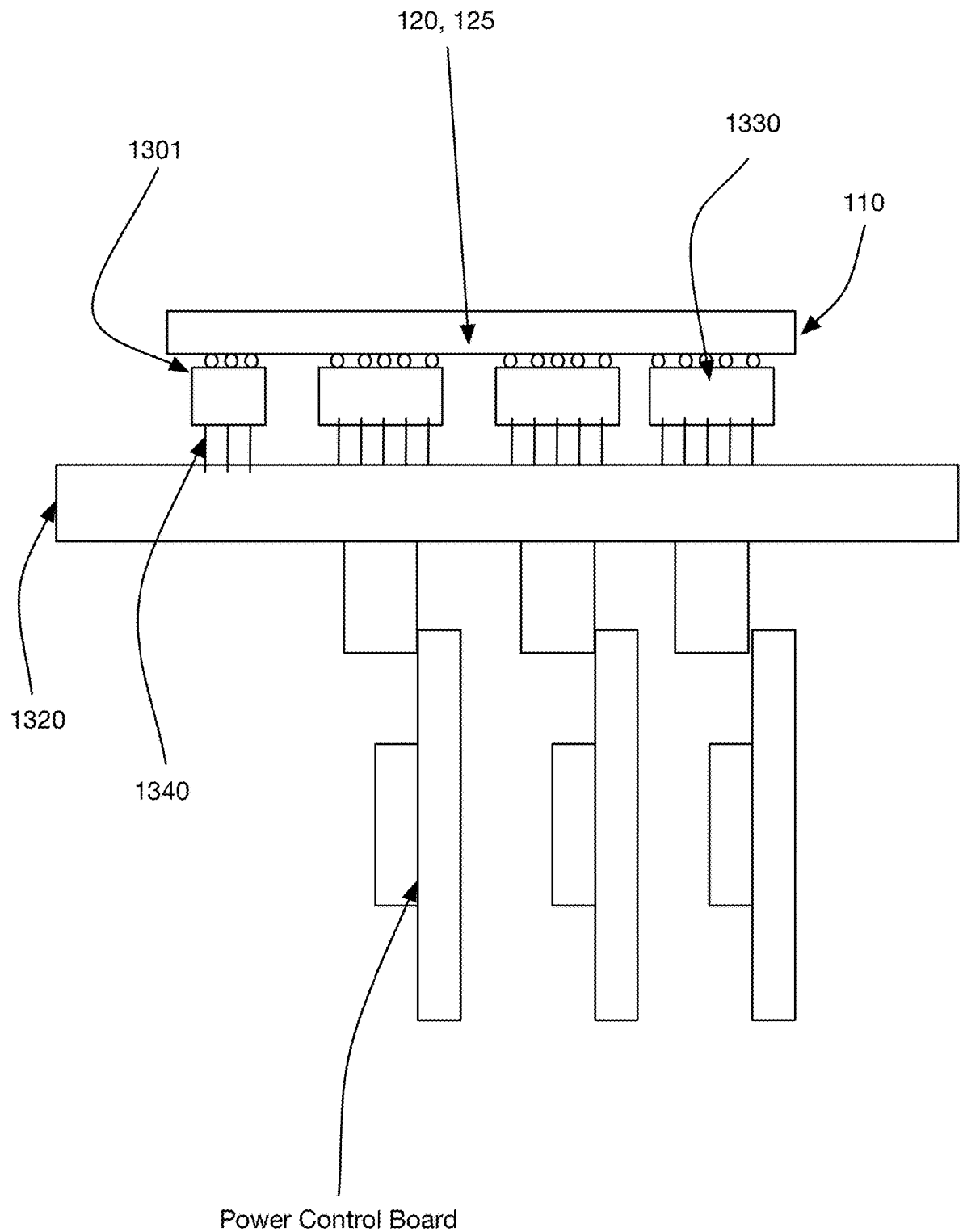
FIG. 7 illustrates a schematic example architecture for a direct attachment of a power component to a wafer or a large semiconductor substrate in accordance with one or more embodiments of the present application.

Additionally, or alternatively, in some embodiments, the one or more power components are preferably connected to and/or supported by a PCB or similar substrate. As shown in FIG. 7, the one or more power components 1330 are preferably connected to a PCB or the like with a compliant connector, such as a compliant connector (similar to compliant connector), to accommodate for coefficient of thermal expansion (CTE) mismatch between the power components and the PCB.

In preferred embodiments, each of the power components may be rigidly attached to the semiconductor substrate 110. Accordingly, in such embodiments, the power components may function to move along with the expansions and contractions of the semiconductor substrate 110 from heating and cooling. Because a supporting PCB or substrate may have a different CTE than the assembly of the power components and the semiconductor substrate 110, the difference in CTE (or the CTE mismatch) between the power components and the PCB may have undesirable effects on the connection between the power components and the PCB when using a standard connection scheme or system. Thus, in a preferred embodiment, one or more electrical connectors (e.g., compliant connectors) may be interposed between the power components and the PCB to enable a connection and support that allows for a CTE mismatch and mitigates the potential for damaging connections between the power components 1330 and the PCB based on a heating and/or cooling of the system components.

In another embodiment, each of the power components can be flexibly attached to the semiconductor substrate 110. The flexible attachment between the power components 1330 and the semiconductor substrate 110 can be the same or different from the flexible attachment between the power components 1330 and the PCB. The flexible attachment between the power components 1330 and the semiconductor substrate 110 can have the same rigidity, be less rigid, or be more rigid than the flexible attachment between the power components 1330 and the PCB. The flexible attachment can be the compliant connector, or be any other suitable flexible attachment.

The power components can be arranged in any suitable location/orientation relative to the PCB and/or integrated circuit. In a first variant, the power component is formed as a part of the integrated circuit (e.g., as a part of in the active circuitry layer, etc.). In a second variant, the power component is a separate integrated circuit or set of integrated circuits packaged separately from the wafer. In a first example of the second variant, power components can be mounted to a PCB (e.g., the PCB mounted and/or electrically coupled to the wafer). In a second example of the second variant, power components can be directly attached to the integrated circuit using static connections (BGA, SMT, etc.), compliant connectors (e.g., spring contacts, pogo pings, elastomeric connectors, etc.), and/or otherwise be directly attached to the integrated circuit. In a third variant, the power component can be a module packaging one or more chips inside a housing/packaging (e.g., rigid and/or compliant material). In a fourth variant, the power component can be split into one more sub-components connected by a PCB, trace, conductive pathway. In the fourth variant, the power sub-components can be mounted on the side of the PCB oriented towards the integrated circuit (e.g., first side of the PCB) and/or the side of the PCB opposite the integrated circuit (e.g., second side of the PCB).

Power components can optionally include a signal pass-through (e.g., a via, secondary electrical connection, etc.) which functions to establish a communication link and/or electrical connection between the PCB and the integrated circuit. The signal pass-through can enable transmission of a: clock signal, low speed signal, high speed signal, data channels, and/or any other appropriate communication. Additionally or alternately, the signal pass-through can include a secondary voltage rail (e.g., 1.8V) and/or secondary power connection from the PCB to the integrated circuit. However, the signal pass-through can be otherwise configured.

The optional set of compression elements 1350 functions to mitigate fluctuating stress and/or fatigue in assembly components resulting from CTE mismatch. Compression elements can additionally or alternately function to establish thermal contact along a thermal interface. Compression elements can additionally or alternately function to bias a cooling component 1364 (e.g., cold plate) towards a thermal interface. Compression elements can additionally or alternately establish an electrical connection between two components. In variants where the electrical connection is a compliant connection, compression elements can additionally or alternately function to establish an electrical connection between a component and the compliant connection (e.g., by biasing the component and the compliant connection together, by biasing the compliant connector toward the compressed mode).

The compression elements can be made of: metal (e.g., spring steel, machined spring, etc.), plastic, thermoplastic, thermoset, foam, elastomer, rubber, and/or other suitable material. In a first variant, the set of compression elements include an elastomeric material such as: thermoset rubbers, unsaturated rubber (e.g., isoprene rubber, BR, CR, IIR, SBR, nitrile rubber, etc.), saturated rubbers (e.g., EPM, ECO, ACM, silicone rubber, FVMQ, FKM, FFKM, PEBA, CSM, EVA, etc.) thermoplastic elastomers (TPE), polysulfide rubber, elastolefin, and/or any other suitable elastomer. In a second variant, the set of compression elements include springs, such as disc springs, volute springs, compression springs, or other springs. The springs can seat in cavities defined in the PCB (e.g., PCB face proximal the wafer), the power component, the cold plate, be otherwise seated, or be unseated. However, the compression elements can include: pressure plates, cold plates, or other compression elements.

The compression element(s) can be formed with and/or bonded to the PCB, integrated circuit, a cooling component 1364, and/or other suitable component.

The compression element(s) preferably demonstrates elastic properties under preload compression, but can alternately be partially elastic, inelastic, and/or have any other appropriate flexural properties. The Young's Modulus (e.g., in the range of compression) can be <0.7 MPa, 0.7 MPa, 1 MPa, 2 MPa, 3 MPa, 4 MPa, 5 MPa, 5.8 MPa, >5.8 MPa, any suitable range bounded by one of the aforementioned values, and/or any other suitable Young's Modulus. The compression element(s) can have any suitable spring constant <1 N/m, 1 N/m, 100 N/m, N/m, 1000 N/m, 10 kN/m, 100 kN/m, 1000 kN/m, >1000 kN/m, any suitable range bounded by one of the aforementioned values, and/or any other suitable spring constant. The compression element(s) can have a Poisson's ratio of: 0.3, 0.35, 0.4, 0.45, 0.5, any suitable range bounded by one of the aforementioned values, and/or any other suitable Poisson's ratio. The compression element(s) flexion can occur about any suitable axis, and can be: normal to the broad face, parallel to the broad face, skewed relative to the broad face, and/or in any other suitable direction.

The compression element(s) can be electrically non-conductive, partially electrically conductive, establish conductive pathways under compression, conductive, and/or have any other suitable electrical properties.

The compression element(s) can include (or function as) a thermal insulator, be thermally conductive, and/or have any other suitable thermal properties. In a first variant, the set of compression elements can include a thermal interface material (TIM). In a first specific example, the TIM compression element can be arranged between the cooling component 1364 (e.g., cold plate associated with the power component) and the power component, establishing a thermal connection between the power component and the cooling system. In a second specific example, the TIM compression element can be arranged between the cooling component and integrated circuit (e.g., on a side opposite the PCB), establishing a thermal connection between the power component and the cooling system (e.g., cold plate associated with the integrated circuit). In a second variant, the set of compression elements can include a thermal insulator arranged between the PCB 1320 and the cooling component (e.g., cold plate associated with the power component).

The compression element(s) can have any suitable arrangement, such as affixed to or engaging: a first side of the PCB, the surface layer of the integrated circuit, the substrate of the integrated circuit, a broad face of a cooling component (e.g., cold plate) proximal the integrated circuit, a broad face of a cooling component (e.g., cold plate) proximal the PCB, side of the power component proximal the PCB, side of power component proximal the integrated circuit, and/or other surface or component. The compression elements can be coplanar or out of plane with: the electrical connectors, the cooling manifolds, the cold plates, and/or any other suitable component. Compression elements can have any suitable arrangement relative to the electrical connector (e.g., compliant connector), such as strips adjacent to the compliant connector. In a specific example, compression element strips are arranged along a cooling component (e.g., cold plate) side proximal the PCB and adjacent to the compliant connector. In a second specific example, compression element strips are arranged along the corners, edges, or a predetermined region of the power component projection onto the PCB.

The compression element(s) can have any appropriate relative or absolute numerosity, such as a single component or multiple distinct components: per power converter, per cooling component, per PCB, per integrated circuit, per die reticle, and/or any other suitable number compression elements (or layers/sections therein).

The compression element(s) can have any suitable thickness, and can extend partially or fully between: the PCB and the integrated circuit, the power converter and the PCB, the power converter (and/or a PCB mounting the power converter) and the integrated circuit, the cooling component and the power converter, the cooling component and the PCB, the integrated circuit and the cooling component, and/or have any other suitable arrangement. The thickness of the compression element(s) can be compressed by engagement of the set of clamping components (e.g., under compressive preload), with the thickness compressed by: 0%, 5%, 10%, 15%, 25%, 50%, 75%, >75%, any range bounded by the aforementioned values, and/or compressed by any other suitable relative amount. The thickness the compression element(s), compressed or uncompressed, can be: <1 mm, 1 mm, 2 mm, 3 mm, 5 mm, 7 mm, 10 mm, 15 mm, >15 mm, any range bounded by the aforementioned values, and/or any other suitable thickness.

Figure 10:
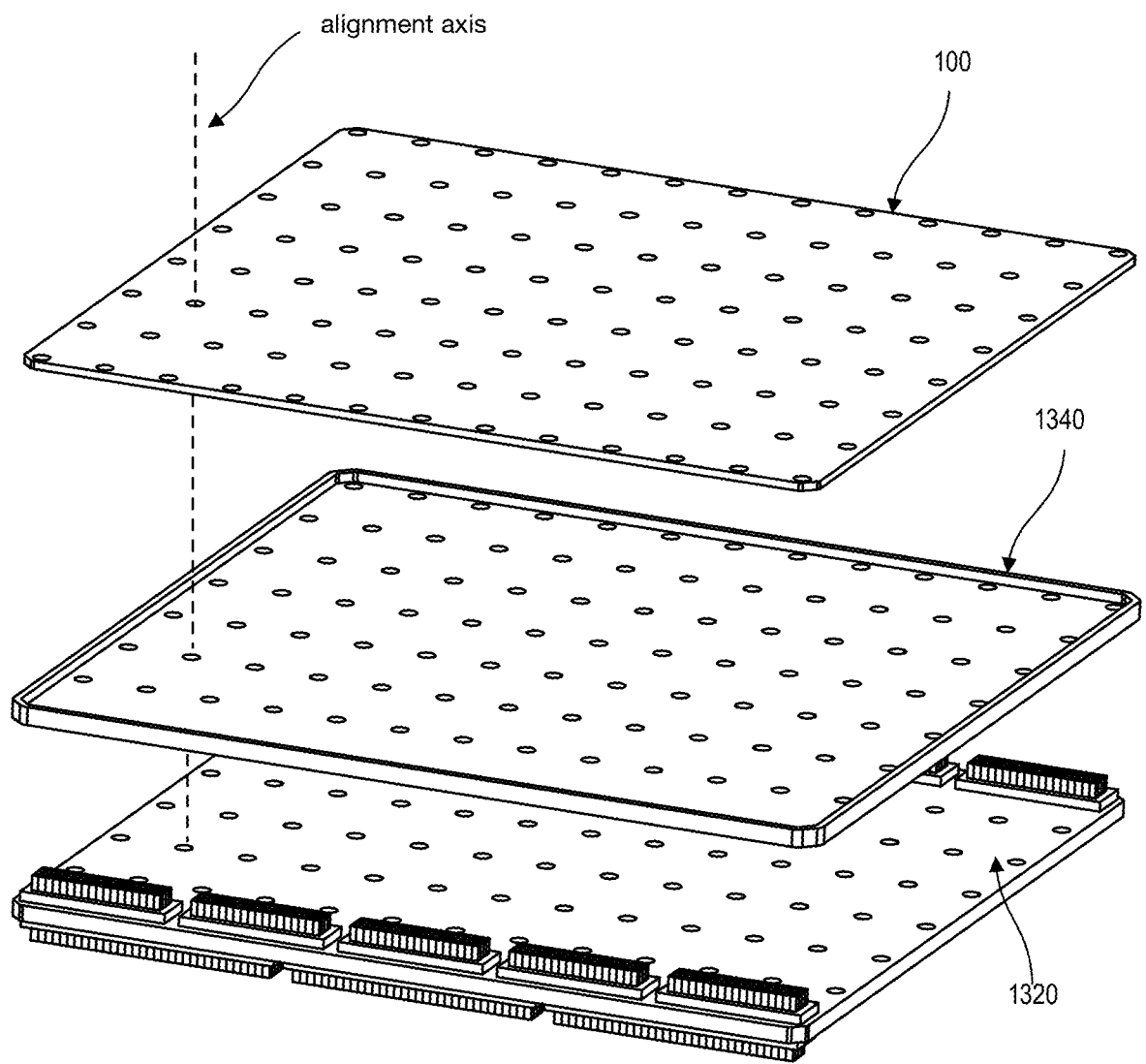
FIG. 10 is an isometric view of an example of a compliant connector arranged between a large substrate and a PCB.

In a first specific variant, the set of compression elements can include the electrical connector, such as in examples where the electrical connector is an elastomeric connector an example of which is shown in FIG. 10.

The electrical connector 1340 functions to electrically connect the PCB to the power source and/or the integrated circuit. The electrical connector 1340 can additionally or alternately function to transfer power and/or signals to the power component or integrated circuit (e.g., dies, die reticles). In variants where the electrical connector 1340 is a compliant connector (e.g., elastomeric connector), the electrical connector can additionally or alternately function to mitigating fluctuating stress and/or fatigue in assembly components resulting from CTE mismatch. The electrical connector is preferably a compliant connector, but can alternately be a rigid connector.

The electrical connector can include any suitable compliant connectors that allow for varying shearing forces applying on the different surfaces of the compliant connector. The compliant connector can be an elastomeric connector (such as a ZEBRA connector), a pogo pin, spring-loaded pin, the compliant connector described in U.S. application Ser. No. 16/029,207 filed 6 Jul. 2018, which is incorporated in its entirety by this reference, and/or any other suitable compliant connector.

In a first example, the electrical connector is an elastomeric connector, with the spacing of conductive elements equal to the PCB conductor spacing and the connector precisely aligned with the PCB conductors (e.g., conductive pads). In a second example, the electrical connector is an elastomeric connector with the spacing of conductive elements less than half of the PCB conductive pad spacing (e.g., tolerant of imprecise alignment).

In a first variant, the compliant connector may include a socket. In such embodiments, the compliant connector when formed as a socket may function to replace one or more parts of the PCB or similar substrate.

In a second variant, the electrical connector can serve as a compression element.

In a third variant, the electrical connector can serve as a first compression element extending over a first portion of the PCB and is adjacent to a second compression element extending over a second (e.g., distinct, overlapping, separate, etc.) portion of the PCB.

In a fourth variant, the electrical connector is a rigid electrical connection.

The optional cooling system 1360 functions to reject thermal energy from the power component, integrated circuit, and/or other suitable components. The cooling system can include passive cooling (e.g., by natural convection, adding thermal mass, etc.) and/or active cooling (e.g., force convection) with any suitable set of cooling components (e.g., cold plates, pumps, fans, fluid manifolds, etc.). The cooling system can include a heat sink (e.g., with fins extending vertically, laterally, or in any appropriate arrangement), which can cool by natural convection or forced convection (e.g., ducted, un-ducted) via convection elements (e.g., fans). The cooling system can include a fluid reservoir 1366 containing any suitable gaseous and/or liquid working fluid such as: water, water-glycol, LN2, air, and/or any other suitable cooling fluids, and a fluid manifold 1362 configured to connect the fluid manifold to other cooling components, heat sources, active/passive heat sinks, and/or other suitable endpoints. The fluid manifold can extend: through the PCB thickness, through the wafer thickness, through the power component, along a layer between the PCB and wafer (e.g., between the PCB and power component, between the wafer and power component), through an interior of a cooling component (an example is shown in FIG. 8), or in any configuration.

The cooling system can include a cold plate 1364, which can be hollow (e.g., defining an interior fluid passage) or solid, which can operate in conjunction with a cooling fluid reservoir, fluid manifold connecting the cold plate(s) to the fluid reservoir. The cold plates can be super-ambient, with a radiator or separate heat sink exceeding ambient temperature, or sub-ambient (e.g., relying on a refrigeration cycle, cooling with LN2, etc.). There can be any suitable relative number of cold plates for each heat generating component (e.g., power component, integrated circuit, etc.), such as one cold plate per heat generating component, multiple cold plates per heat generating components, multiple heat generating components per cold plate, and/or any other suitable number of cold plates.

The cold plates can extend along all or a portion of the heat-generating component broad face (e.g., power component broad face) proximal the PCB, all or a portion of the heat-generating component broad face distal the PCB, along a side of the power component, or along any portion of the power component. Additionally or alternatively, cooling components can be thermally connected to the wafer (e.g., a broad face of the wafer opposing the PCB, opposing the power component, etc.), the PCB, and/or any other appropriate component or heat source/sink.

Cooling components 1364 (e.g., cold plates, heat sinks, etc.) can be thermally connected to the heat-generating component at a thermal interface by a TIM such as thermal grease, thermal adhesive, thermal gap filler, thermally conductive pad (e.g., silicone sheet), thermal tape, phase change material, metal TIM, a compressive element TIM, and/or any other suitable TIM. In a first example, the TIM can be a thermally conductive elastomer sandwiched between the cold plate and the power component. In a second example, the TIM can be a thermally conductive elastomer sandwiched between the cold plate and the wafer.

In a first variant, cooling components can be arranged between the power component and the PCB. In a specific example, the fluid manifold can extend through a thickness of the PCB, fluidly connecting the cold plate to the fluid reservoir. In a second specific example, the fluid manifold can extend through a thickness of the integrated circuit (e.g., through an aperture).

In a second variant, cooling components can be arranged on the side of the integrated circuit opposite the PCB. In a specific example, the cold plate is thermally connected to the broad face of the substrate.

Figure 11:
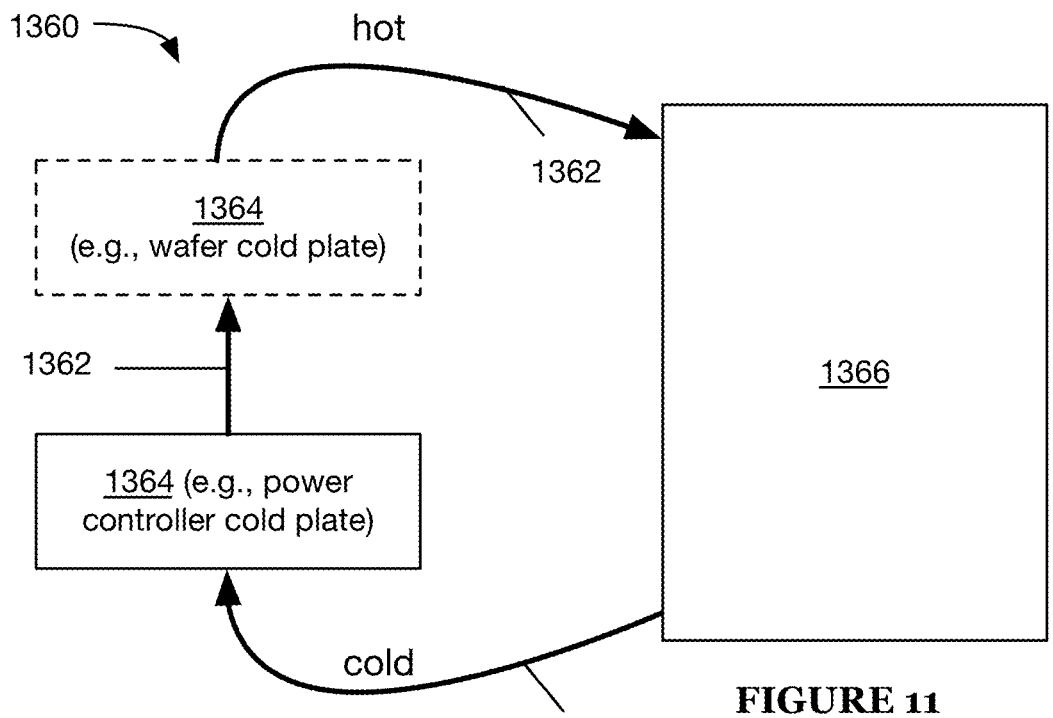
FIG. 11 is a schematic example of an embodiment of a cooling system with cooling components in series.
Figure 12:
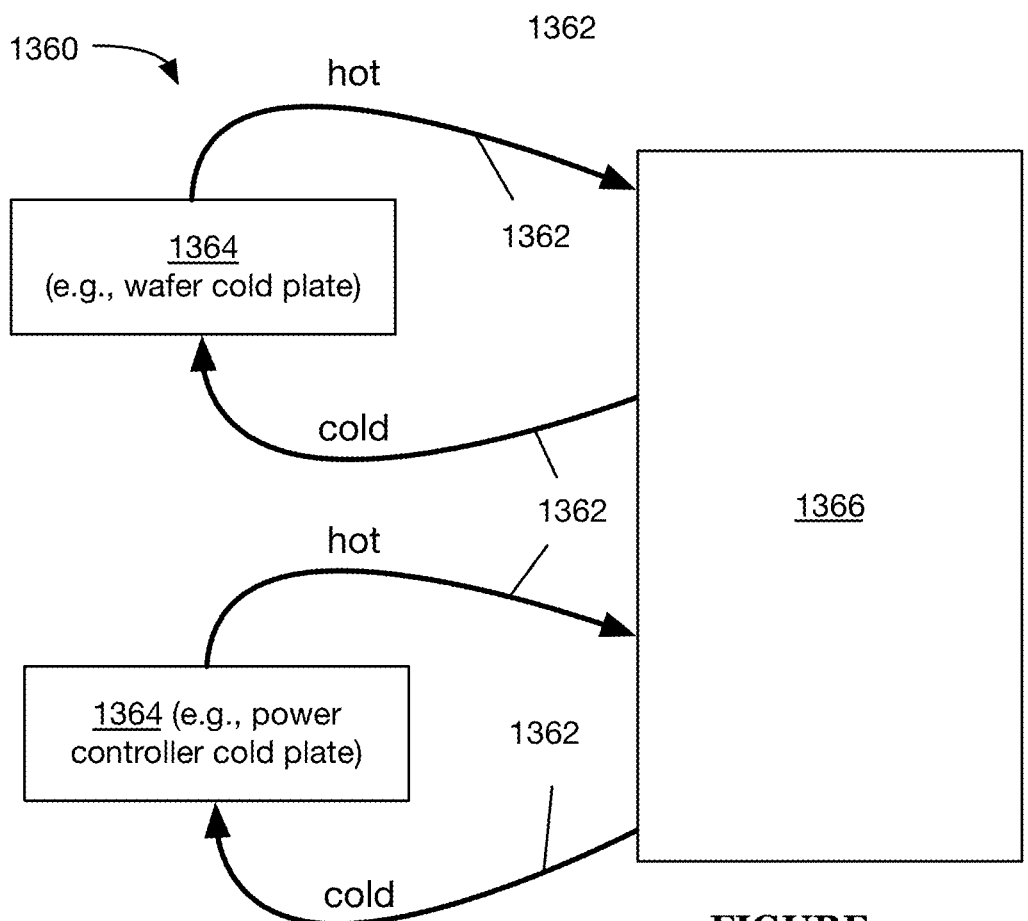
FIG. 12 is a schematic example of an embodiment of cooling system with cooling components in parallel.

In a third variant, a first cooling component (e.g., cold plate) is associated with the power converter and a second cooling component (e.g., cold plate) is associated with the integrated circuit. In a first specific example, the first and second cooling components are connected in series by the fluid manifold—an example is shown in FIG. 11. In a second specific example, the first and second cooling components are connected in parallel—an example is shown in FIG. 12.

Figure 18:
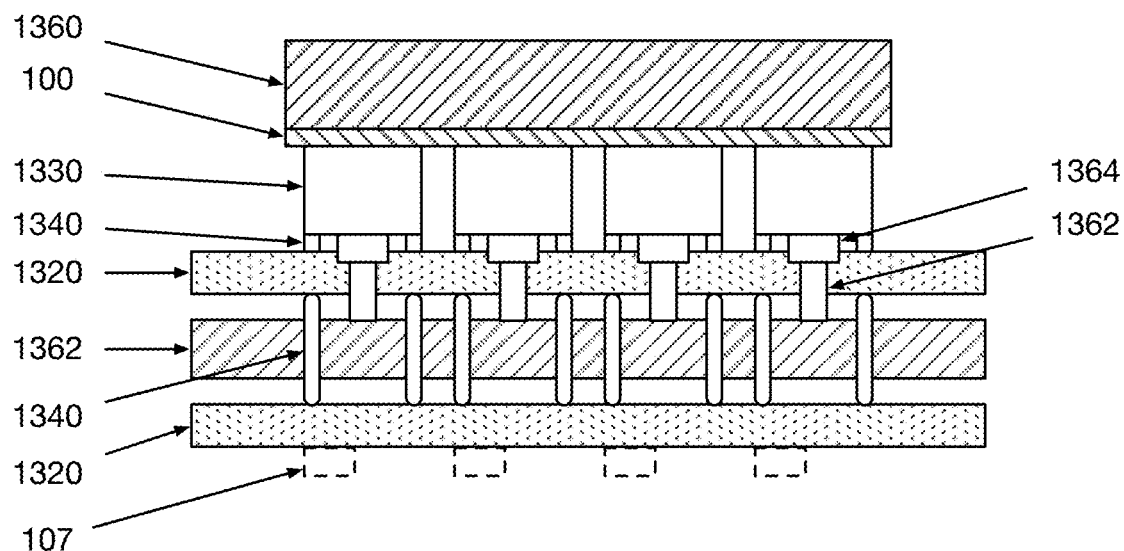
FIG. 18 is a cross section view of an example architecture for powering an integrated circuit which does not include an intermediary PCB as the electrical connector between the wafer and the power component.

In a fourth variant, the cooling component contacts a first region 1520 of the broad face 1510 of the power component and a compressive element contacts a second region 1530 of the broad face 1510 of the power component. The first and/or second regions can individually or collectively define a perimeter region, periphery region, interior region, corner region, side region, strip, bisect the broad face, cover less than half of the broad face, cover more than half of the broad face, cover all of the broad face, divide the broad face in an even/uneven pattern (e.g., grid, striped, etc.), or have any other suitable arrangement. Examples of the arrangement of the first and second regions are shown in FIGS. 15A-15F. In a first specific example of the fourth variant, the first region defines an interior region of the broad face and the second region defines a perimeter region of the broad face, (e.g., as shown in the examples in FIG. 17 and FIG. 18).

The optional set of mechanical clamping components 1370 functions to preload the compressive elements by compressing them between the PCB and the integrated circuit. The set of mechanical clamping components can additionally or alternately function to establish thermal contact along thermal interfaces of cooling components and/or electrical contact between two components of the system. The mechanical clamping components can have any suitable arrangement, and can: extend through a thickness of the PCB and/or integrated circuit (substrate and/or active layer); have a uniform distribution such as rectangular grid, triangular grid, evenly spaced, and/or otherwise appropriately distributed, or otherwise uniformly compress the compressive element(s); be symmetrically distributed; asymmetrically distributed; relatively distributed based on material CTEs; and/or be otherwise distributed. Mechanical clamping components can include mechanical fasteners (e.g., bolts, machine screws, nuts, pem nuts), positive locking mechanisms (e.g., nylock, safety wiring, tab washer, coaxial screw preventing fastener backout, and/or other positive locking), springs (e.g., Belleville springs, disk washers, compression spring, etc.), washers, and/or other appropriate components. In a specific example, the set of mechanical clamping components and/or distribution of clamping components is as described in U.S. application Ser. No. 16/056,792 filed 7 Aug. 2018, which is incorporated in its entirety by this reference.

In a specific example, the set of mechanical clamping components can be arranged relative to the hole pattern illustrated in FIG. 15.

The optional power source 1380 functions to provide power to the PCB, power components, and/or integrated circuit. The system can include one or more power sources for the system, per power component, per die reticle, per PCB, per integrated circuit, and/or any other suitable number of power sources. The power sources can have any suitable arrangement, such as mounted to the PCB (e.g., distal the power component, along the backside, etc.), arranged adjacent to the PCB with power routed to the electrical pathways by traces (e.g., along PCB backside) or wires, or otherwise suitably arranged. The power sources (and/or power controllers or power control boards) can be mounted parallel the PCB, orthogonal to the PCB (e.g., PCB main plane, with a right angled connector, etc.), or otherwise connected to the PCB. In a first variant, the power source can provide AC or DC power with single or dual polarity. In a second example, the power source provides power of the same type as the input to the power component.

Additionally, or alternatively, other integrated circuit components may be added onto the semiconductor substrate 110. Other IC components can be mounted alongside one or more power components 1330, on the power control boards, on the backside of the PCB (e.g., opposing the wafer or the power converter), and/or otherwise arranged. Examples of other IC components include: input/output (I/O) chiplets, power decoupling capacitors, or other components. For instance, in some embodiments, one or more input/output (I/O) chiplets may be provided onto a surface of the semiconductor substrate 110 that enables fast I/O connections into and/or out of the semiconductor substrate 110. The I/O chiplet 1301 may have I/O connections (at a very high pitch) towards the wafer or semiconductor substrate 110 and a lower number of connections toward the PCB, which enables very high communication signals between the semiconductor substrate 110 and the PCB. In this way, the large wafer or large semiconductor substrate 110 may be relieved from having too large of I/Os formed on the wafer or semiconductor substrate, itself.

It shall be understood that the methods described herein are exemplary methods that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

I claim:

1. An assembly comprising:
    a printed circuit board (PCB) defining a first surface of the PCB;
    a semiconductor, defining a second surface of the semiconductor, comprising:
    a substrate; and
    a first die and a second die formed within the substrate;
    a first and second power converter arranged between the first surface of the PCB and the second surface of the semiconductor, the first and second power converters electrically connected to the first and second die, respectively;
    a compliant connector electrically connecting the PCB and the first power converter;
    a first cold plate, arranged between the first power converter and the PCB, that is thermally connected to the first power converter;
    a fluid reservoir; and
    a fluid manifold extending through a thickness of the PCB and connecting the first cold plate to the reservoir,
    wherein the second power converter is electrically coupled to the PCB.

2. The assembly of claim 1, wherein the semiconductor further comprises:
    a circuit layer formed at each of the first and second die; and
    a plurality of inter-die connections communicatively connecting the first and second die.

3. The assembly of claim 1, further comprising a compression element arranged between the PCB and the first power converter.

4. The assembly of claim 3, wherein the compression element comprises the compliant connector.

5. The assembly of claim 3, further comprising a plurality of clamping components mechanically coupling the PCB to the semiconductor and preloading the compression element.

6. The assembly of claim 1, further comprising:
    a second cold plate arranged proximate a third surface of the semiconductor opposite the second surface of the semiconductor;
    wherein the fluid manifold fluidly connects the first cold plate and the second cold plate.

7. The assembly of claim 1, wherein the semiconductor comprises a wafer-scale processor.

8. The assembly of claim 1, wherein the power converter comprises a voltage regulator, a current transformer, and a driver.

9. The assembly of claim 1, further comprising:
    a power source opposing the first power converter across a thickness of the PCB; and
    a via extending through a thickness of the PCB, the via electrically connecting the power source to the compliant connector.

* * * * *